(12) United States Patent
Hu et al.

(10) Patent No.: US 11,790,826 B2
(45) Date of Patent: Oct. 17, 2023

(54) SHIFT REGISTER AND DRIVING METHOD THEREOF, DRIVE CIRCUIT AND DISPLAY DEVICE

(71) Applicants: Fuzhou BOE Optoelectronics Technology Co., Ltd., Fuzhou (CN); BOE Technology Group Co., Ltd., Beijing (CN)

(72) Inventors: Bo Hu, Beijing (CN); Sang Jin Park, Beijing (CN); Wenchao Wang, Beijing (CN); Linlin Lin, Beijing (CN)

(73) Assignees: Fuzhou BOE Optoelectronics Technology Co., Ltd., Fujian (CN); BOE Technology Group Co., Ltd., Beijing (CN)

( * ) Notice: Subject to any disclaimer, the term of this patent is extended or adjusted under 35 U.S.C. 154(b) by 240 days.

(21) Appl. No.: 17/418,209

(22) PCT Filed: Dec. 29, 2020

(86) PCT No.: PCT/CN2020/140797
§ 371 (c)(1),
(2) Date: Jun. 24, 2021

(87) PCT Pub. No.: WO2021/159875
PCT Pub. Date: Aug. 19, 2021

(65) Prior Publication Data
US 2023/0137332 A1    May 4, 2023

(30) Foreign Application Priority Data
Feb. 10, 2020   (CN) .......................... 202010084660.8

(51) Int. Cl.
*G09G 3/20*      (2006.01)
*G11C 19/28*     (2006.01)

(52) U.S. Cl.
CPC .......... *G09G 3/2092* (2013.01); *G11C 19/28* (2013.01); *G09G 2310/0286* (2013.01); *G09G 2310/061* (2013.01)

(58) Field of Classification Search
CPC .......... G11C 19/28; G09G 2310/0286; G09G 3/2092; G09G 3/20; G09G 2310/061
See application file for complete search history.

(56) References Cited

U.S. PATENT DOCUMENTS 11,380,280 B2 * 7/2022 Liu ...................... G09G 3/3674
2014/0043373 A1  2/2014 Kim
(Continued)

FOREIGN PATENT DOCUMENTS

CN      103578446 A  *  2/2014
CN      103578446 A     2/2014
(Continued)

OTHER PUBLICATIONS

Machine translation for CN 105632562 A, Jun. 2016 (Year: 2016).*
Machine translation of CN 103578446, Feb. 2014 (Year: 2014).*
CN202010084660.8 first office action .

*Primary Examiner* — Xuemei Zheng
(74) *Attorney, Agent, or Firm* — IPRO, PLLC

(57) ABSTRACT

Provided are a shift register and a driving method thereof, a drive circuit and a display device. A first capacitor is provided with a first terminal electrically connected to a cascade signal output terminal and a second terminal electrically connected to a fixed voltage signal terminal, so that a load capacitance of the cascade signal output terminal is compensated, and the charging and discharging process of the first capacitor is combined to reduce a noise of a signal of the cascade signal output terminal and improve the signal stability of the cascade signal output terminal.

14 Claims, 16 Drawing Sheets

(56) References Cited

U.S. PATENT DOCUMENTS

| | | | |
|---|---|---|---|
| 2017/0193945 A1 | 7/2017 | Feng | |
| 2019/0371422 A1* | 12/2019 | Wang | .................... G09G 3/3674 |
| 2021/0065599 A1* | 3/2021 | Feng | ...................... G11C 19/28 |
| 2021/0065647 A1 | 3/2021 | Tang et al. | |
| 2021/0082368 A1 | 3/2021 | Li | |
| 2021/0335317 A1 | 10/2021 | Liu et al. | |

FOREIGN PATENT DOCUMENTS

| | | | | |
|---|---|---|---|---|
| CN | 104123905 A | | 10/2014 | |
| CN | 105632562 A | * | 6/2016 | |
| CN | 105632562 A | | 6/2016 | |
| CN | 108564930 A | * | 9/2018 | |
| CN | 108564930 A | | 9/2018 | |
| CN | 108766336 A | * | 11/2018 | |
| CN | 108962330 A | * | 12/2018 | |
| CN | 110415637 A | | 11/2019 | |
| CN | 110634528 A | | 12/2019 | |
| CN | 110648621 A | | 1/2020 | |
| CN | 111243651 A | | 6/2020 | |

\* cited by examiner

SHIFT REGISTER AND DRIVING METHOD THEREOF, DRIVE CIRCUIT AND DISPLAY DEVICE

CROSS-REFERENCES TO RELATED DISCLOSURE

The present disclosure is a National Stage of International Application No. PCT/CN2020/140797, filed on Dec. 29, 2020, which claims the priority to Chinese Patent Application No. 202010084660.8, filed with the China National Intellectual Property Administration on Feb. 10, 2020, the content of which are incorporated herein by reference in their entirety.

FIELD

The present disclosure relates to a field of display technology, in particular to a shift register and a driving method thereof, a drive circuit and a display device.

BACKGROUND

With the rapid development of display technology, display devices are increasingly developing into the direction of high integration and low cost. A GOA (Gate Driver on Array) technology integrates a TFT (Thin Film Transistor) gate drive circuit on an array substrate of a display device to form a scan drive for the display device. The gate drive circuit is usually composed of a plurality of cascaded shift registers. However, the output of shift register is unstable, resulting in an abnormal display.

SUMMARY

In a first aspect, an embodiment of the present disclosure provides a shift register, including:
- an input circuit, configured to, in response to a signal of an input signal terminal, supply the signal of the input signal terminal to a first node;
- a reset circuit, configured to, in response to a signal of a reset signal terminal, supply a signal of a first reference signal terminal to the first node;
- a control circuit, configured to adjust a signal of the first node and a signal of a second node;
- a first output circuit, configured to output a signal from a cascade signal output terminal according to the signal of the first node and the signal of the second node;
- a first capacitor, provided with a first terminal electrically connected to the cascade signal output terminal, and a second terminal electrically connected to a fixed voltage signal terminal; and
- a second output circuit, configured to output a signal from a drive signal output terminal according to the signal of the first node and the signal of the second node.

Optionally, according to an embodiment of the present disclosure, the second node includes M second child nodes; and the control circuit includes M sub-control circuits; wherein an $m^{th}$ sub-control circuit of the M sub-control circuits corresponds to an $m^{th}$ second child node of the M second child nodes; M is an integer and M≥1, and m is an integer and 1≤m≤M;

the $m^{th}$ sub-control circuit is configured to adjust a signal of the $m^{th}$ second child node and the signal of the first node;

the first output circuit is configured to output a signal from the cascade signal output terminal according to the signal of the first node and signals of the M second child nodes; and the second output circuit is configured to output a signal from the drive signal output terminal according to the signal of the first node and the signals of the M second child nodes.

Optionally, according to an embodiment of the present disclosure, the $m^{th}$ sub-control circuit corresponds to an $m^{th}$ selection control signal terminal;

the $m^{th}$ sub-control circuit includes an $m^{th}$ first transistor, an $m^{th}$ second transistor, an $m^{th}$ third transistor, an $m^{th}$ fourth transistor and an $m^{th}$ fifth transistor;

a control terminal and a first terminal of the $m^{th}$ first transistor are electrically connected to the $m^{th}$ selection control signal terminal, and a second terminal of the $m^{th}$ first transistor is electrically connected to a control terminal of the $m^{th}$ second transistor;

a first terminal of the $m^{th}$ second transistor is electrically connected to the $m^{th}$ selection control signal terminal, and a second terminal of the $m^{th}$ second transistor is electrically connected to the $m^{th}$ second child node;

a control terminal of the $m^{th}$ third transistor is electrically connected to the first node, a first terminal of the $m^{th}$ third transistor is electrically connected to the first reference signal terminal, and a second terminal of the $m^{th}$ third transistor is electrically connected to the $m^{th}$ second child node;

a control terminal of the $m^{th}$ fourth transistor is electrically connected to the first node, a first terminal of the $m^{th}$ fourth transistor is electrically connected to the first reference signal terminal, and a second terminal of the $m^{th}$ fourth transistor is electrically connected to a control terminal of the $m^{th}$ second transistor;

a control terminal of the $m^{th}$ fifth transistor is electrically connected to the $m^{th}$ second child node, a first terminal of the $m^{th}$ fifth transistor is electrically connected to the first reference signal terminal, and a second terminal of the $m^{th}$ fifth transistor is electrically connected to the first node.

Optionally, according to an embodiment of the present disclosure, the first output circuit includes a sixth transistor and M seventh transistors; wherein the $m^{th}$ seventh transistor of the M seventh transistors corresponds to the $m^{th}$ second child node;

a control terminal of the sixth transistor is electrically connected to the first node, a first terminal of the sixth transistor is electrically connected to a clock signal terminal, and a second terminal of the sixth transistor is electrically connected to the cascade signal output terminal;

a control terminal of the $m^{th}$ seventh transistor is electrically connected to the $m^{th}$ second child node, a first terminal of the $m^{th}$ seventh transistor is electrically connected to the first reference signal terminal, and a second terminal of the $m^{th}$ seventh transistor is electrically connected to the cascade signal output terminal.

Optionally, according to an embodiment of the present disclosure, the second output circuit includes an eighth transistor, a second capacitor and M ninth transistors; wherein an $m^{th}$ ninth transistor of the M ninth transistors corresponds to the $m^{th}$ second child node;

a control terminal of the eighth transistor is electrically connected to the first node, a first terminal of the eighth transistor is electrically connected to a clock signal terminal, and a second terminal of the eighth transistor is electrically connected to the drive signal output terminal;

a first terminal of the second capacitor is electrically connected to the first node, and a second terminal of the second capacitor is electrically connected to the drive signal output terminal;

a control terminal of the m$^{th}$ ninth transistor is electrically connected to the m$^{th}$ second child node, a first terminal of the m$^{th}$ ninth transistor is electrically connected to a second reference signal terminal, and a second terminal of the m$^{th}$ ninth transistor is electrically connected to the drive signal output terminal.

Optionally, according to an embodiment of the present disclosure, the input circuit includes a tenth transistor; wherein a control terminal and a first terminal of the tenth transistor are electrically connected to the input signal terminal, and a second terminal of the tenth transistor is electrically connected to the first node; and/or, the reset circuit includes an eleventh transistor; wherein a control terminal of the eleventh transistor is electrically connected to the reset signal terminal, and a second terminal of the eleventh transistor is electrically connected to the first node.

Optionally, according to an embodiment of the present disclosure, the shift register also includes M node voltage regulator circuits; wherein an m$^{th}$ node voltage regulator circuit of the M node voltage regulator circuits corresponds to the m$^{th}$ second child node;

the m$^{th}$ node voltage regulator circuit is configured to supply the signal of the first reference signal terminal to the m$^{th}$ second child node in response to the signal of the input signal terminal.

Optionally, according to an embodiment of the present disclosure, the m$^{th}$ node voltage regulator circuit includes an m$^{th}$ twelfth transistor;

a control terminal of the m$^{th}$ twelfth transistor is electrically connected to the input signal terminal, a first terminal of the m$^{th}$ twelfth transistor is electrically connected to the first reference signal terminal, and a second terminal of the m$^{th}$ twelfth transistor is electrically connected to the m$^{th}$ second child node.

Optionally, according to an embodiment of the present disclosure, the shift register also includes a thirteenth transistor;

a control terminal of the thirteenth transistor is electrically connected to an initial reset signal terminal, a first terminal of the thirteenth transistor is electrically connected to the first reference signal terminal, and a second terminal of the thirteenth transistor is electrically connected to the first node.

In a second aspect, an embodiment of the present disclosure provides a shift register, including:

a first first transistor, provided with a control terminal and a first terminal electrically connected to a first selection control signal terminal, and a second terminal electrically connected to a control terminal of a first second transistor;

the first second transistor, provided with a first terminal electrically connected to the first selection control signal terminal, and a second terminal electrically connected to a first second child node;

a first third transistor, provided with a control terminal electrically connected to a first node, a first terminal electrically connected to a first reference signal terminal, and a second terminal electrically connected to the first second child node;

a first fourth transistor, provided with a control terminal electrically connected to the first node, a first terminal electrically connected to the first reference signal terminal, and a second terminal electrically connected to a control terminal of the first second transistor;

a first fifth transistor, provided with a control terminal electrically connected to the first second child node, a first terminal electrically connected to the first reference signal terminal, and a second terminal electrically connected to the first node;

a sixth transistor, provided with a control terminal electrically connected to the first node, a first terminal electrically connected to a clock signal terminal, and a second terminal electrically connected to a cascade signal output terminal;

a first seventh transistor, provided with a control terminal electrically connected to the first second child node, a first terminal electrically connected to the first reference signal terminal, and a second terminal electrically connected to the cascade signal output terminal;

an eighth transistor, provided with a control terminal electrically connected to the first node, a first terminal electrically connected to a clock signal terminal, and a second terminal electrically connected to an drive signal output terminal;

a first ninth transistor, provided with a control terminal electrically connected to the first second child node, a first terminal electrically connected to a second reference signal terminal, and a second terminal electrically connected to the drive signal output terminal;

a tenth transistor, provided with a control terminal and a first terminal electrically connected to an input signal terminal, and a second terminal electrically connected to the first node;

an eleventh transistor, provided with a control terminal electrically connected to a reset signal terminal, and a second terminal electrically connected to the first node;

a twelfth transistor, provided with a control terminal electrically connected to the input signal terminal, a first terminal electrically connected to the first reference signal terminal, and a second terminal electrically connected to the first second child node;

a thirteenth transistor, provided with a control terminal electrically connected to an initial reset signal terminal, a first terminal electrically connected to the first reference signal terminal, and a second terminal electrically connected to the first node.

In a third aspect, an embodiment of the present disclosure provides a shift register, including:

a first first transistor, provided with a control terminal and a first terminal electrically connected to a first selection control signal terminal, and a second terminal electrically connected to a control terminal of a first second transistor;

the first second transistor, provided with a first terminal electrically connected to the first selection control signal terminal, and a second terminal electrically connected to a first second child node;

a first third transistor, provided with a control terminal electrically connected to a first node, a first terminal electrically connected to a first reference signal terminal, and a second terminal electrically connected to the first second child node;

a first fourth transistor, provided with a control terminal electrically connected to the first node, a first terminal electrically connected to the first reference signal terminal, and a second terminal electrically connected to a control terminal of the first second transistor;

a first fifth transistor, provided with a control terminal electrically connected to the first second child node, a first terminal electrically connected to the first reference signal terminal, and a second terminal electrically connected to the first node;

a second first transistor, provided with a control terminal and a first terminal electrically connected to a second selection control signal terminal, and a second terminal electrically connected to a control terminal of a second second transistor;

the second second transistor, provided with a first terminal electrically connected to the second selection control signal terminal, and a second terminal electrically connected to a second second child node;

a second third transistor, provided with a control terminal electrically connected to the first node, a first terminal electrically connected to the first reference signal terminal, and a second terminal electrically connected to the second second child node;

a second fourth transistor, provided with a control terminal electrically connected to the first node, a first terminal electrically connected to the first reference signal terminal, and a second terminal electrically connected to the control terminal of the second second transistor;

a second fifth transistor, provided with a control terminal electrically connected to the second second child node, a first terminal electrically connected to the first reference signal terminal, and a second terminal electrically connected to the first node;

a sixth transistor, provided with a control terminal electrically connected to the first node, a first terminal electrically connected to a clock signal terminal, and a second terminal electrically connected to a cascade signal output terminal;

a first seventh transistor, provided with a control terminal electrically connected to the first second child node, a first terminal electrically connected to the first reference signal terminal, and a second terminal electrically connected to the cascade signal output terminal;

a second seventh transistor, provided with a control terminal electrically connected to the second second child node, a first terminal electrically connected to the first reference signal terminal, and a second terminal electrically connected to the cascade signal output terminal;

an eighth transistor, provided with a control terminal electrically connected to the first node, a first terminal electrically connected to a clock signal terminal, and a second terminal electrically connected to an drive signal output terminal;

a first ninth transistor, provided with a control terminal electrically connected to the first second child node, a first terminal electrically connected to a second reference signal terminal, and a second terminal electrically connected to the drive signal output terminal;

a second ninth transistor, provided with a control terminal electrically connected to the second second child node, a first terminal electrically connected to the second reference signal terminal, and a second terminal electrically connected to the drive signal output terminal;

a tenth transistor, provided with a control terminal and a first terminal electrically connected to an input signal terminal, and a second terminal electrically connected to the first node;

an eleventh transistor, provided with a control terminal electrically connected to a reset signal terminal, and a second terminal electrically connected to the first node;

a first twelfth transistor, provided with a control terminal electrically connected to the input signal terminal, and a first terminal electrically connected to the first reference signal terminal, and a second terminal electrically connected to the first second child node;

a second twelfth transistor, provided with a control terminal electrically connected to the input signal terminal, and a first terminal electrically connected to the first reference signal terminal, and a second terminal electrically connected to the second second child node;

a thirteenth transistor, provided with a control terminal electrically connected to an initial reset signal terminal, a first terminal electrically connected to the first reference signal terminal, and a second terminal electrically connected to the first node.

In a fourth aspect, an embodiment of the present disclosure provides a drive circuit, including a plurality of cascaded shift registers each provided by the embodiment of the present disclosure;

an input signal terminal of a first-stage shift register is electrically connected to a frame trigger signal terminal;

in adjacent two-stage shift registers, an input signal terminal of a next-stage shift register is electrically connected to a cascade signal output terminal of a previous-stage shift register, and a reset signal terminal of the previous-stage shift register is electrically connected to a cascade signal output terminal of the next-stage shift register.

In a fifth aspect, an embodiment of the present disclosure provides a display device, including the drive circuit provided by the embodiment of the present disclosure.

In a sixth aspect, an embodiment of the present disclosure provides a driving method for the shift register in the embodiment of the present disclosure, wherein the driving method includes:

in an input phase, loading a first level signal onto the input signal terminal, and loading a second level signal onto the reset signal terminal and the clock signal terminal;

in an output phase, loading the second level signal onto the input signal terminal and the reset signal terminal, and loading the first level signal onto the clock signal terminal;

in a reset phase, loading the second level signal onto the input signal terminal, loading the first level signal onto the reset signal terminal, and loading the second level signal onto the clock signal terminal.

DETAILED DESCRIPTION OF THE EMBODIMENTS

To explain more clearly the purpose, technical solution and advantages of the embodiments of the present disclosure, the technical solution of the embodiments of the present disclosure will be described clearly and completely with reference to the accompanying drawings of the embodiments of the present disclosure. Obviously, the described embodiments are some embodiments of the present disclosure, but not all of them. The embodiments in the present disclosure and the features in the embodiments may be combined with each other without conflict. The embodiments in the present disclosure and the features in the embodiments may be combined with each other without conflict.

Unless otherwise defined, the technical or scientific terms used in the present disclosure shall be understood in a usual sense by those of ordinary skill in the art to which the present disclosure belongs. The terms "first," "second," and the like as used in the present disclosure do not denote any order, quantity, or importance, but are used only to distinguish different components. The words "including" or "comprising" and the like are intended to mean that the component or object appearing before the word covers a component or object appearing after the word and an equivalent thereof, and does not exclude other components or objects. Similar terms such as "connected to" or "electrically connected to" are not limited to physical or mechanical connections, but may include electrical connections, whether direct or indirect.

It should be noted that the size and shape of each figure in the accompanying drawings do not reflect a true scale, and are just intended to schematically illustrate the contents of the present disclosure. Moreover, the same or similar signs throughout represent the same or similar elements or elements with the same or similar functions.

Figure 1:
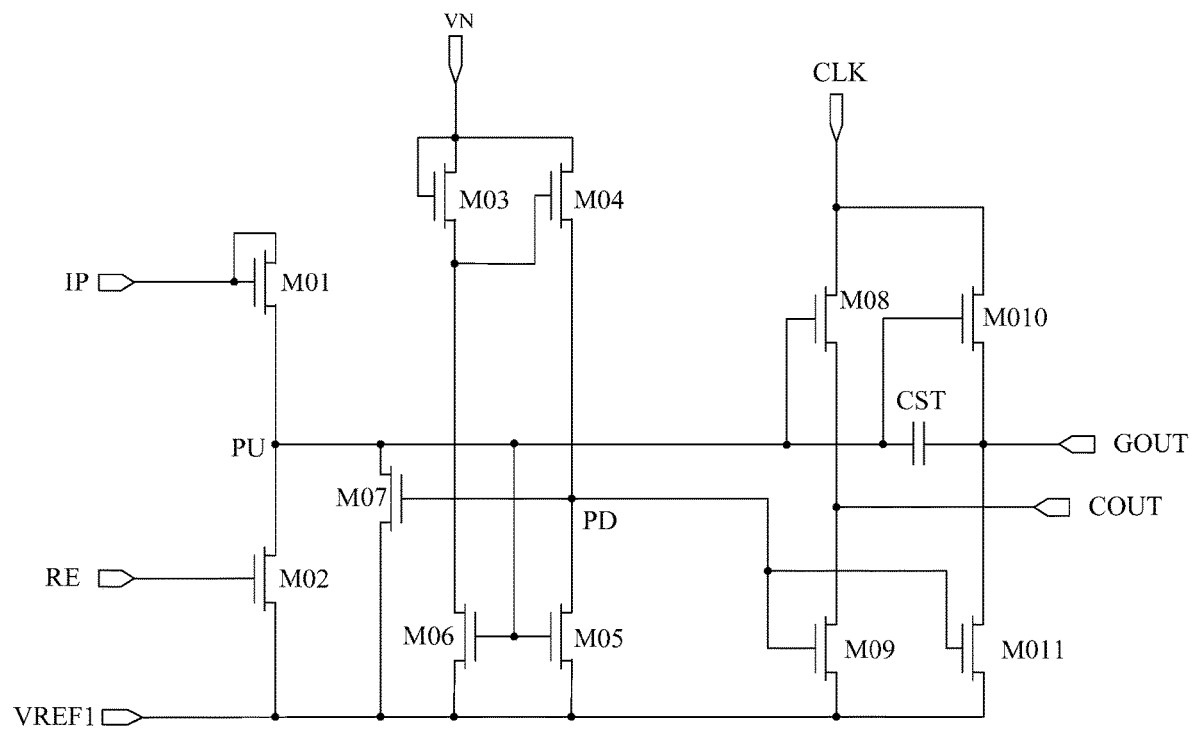
FIG. 1 is a structural diagram of a shift register in the related art.
Figure 2:
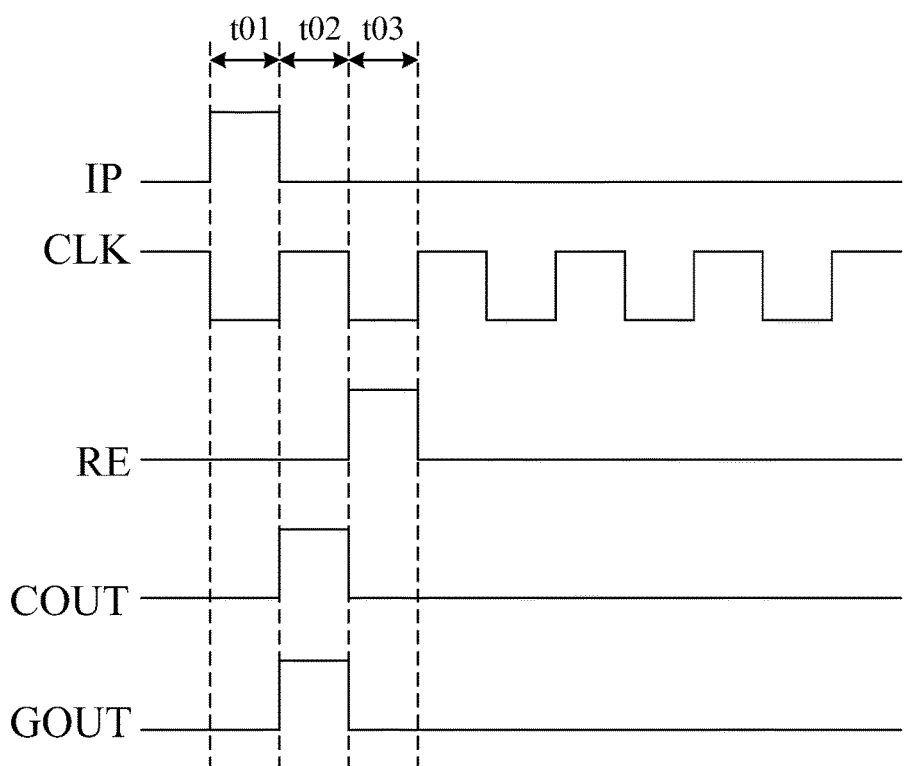
FIG. 2 is a signal time sequence diagram of a shift register shown in FIG. 1.

As shown in FIG. 1, a shift register generally includes transistors M01 to M011 and a capacitor CST. FIG. 2 shows a signal time sequence diagram corresponding to the shift register shown in FIG. 1.

It may be seen from FIG. 2 that the output terminal COUT outputs a high-level signal in the t02 phase and outputs a low-level signal in the remaining phases except the t02 phase. In practical application, the output terminal COUT outputs corresponding signals through the mutual cooperation of the transistors M01~M011.

In practical application, the output terminal COUT is connected to the transistor M02 in the previous grade of shift register and the transistor M01 in the next grade of shift register at the same time, resulting in a small capacitance load connected to the output terminal COUT. In most cases, the noise of a signal at the output terminal COUT mainly comes from the coupling of the clock signal CLK through the parasitic capacitance of the transistor M08. In the early stage of using the shift register, the threshold voltage Vth of the transistor has small drift amplitude, which makes the noise reduction ability of the transistor M09 strong so that the noise on the signal output by the output terminal COUT may be released through the transistor M09. However, the threshold voltage Vth of the transistor drifts greatly with the increase of the service time of the shift register, which reduces the noise reduction ability of the transistor M09, and makes it difficult for the transistor M09 to release the noise on a signal output by the output terminal COUT in time. In addition, because of small capacitance load connected to the output COUT (for example, only a few tenths of pF), the clock signal CLK will couple a large noise to the output terminal COUT.

Figure 3:
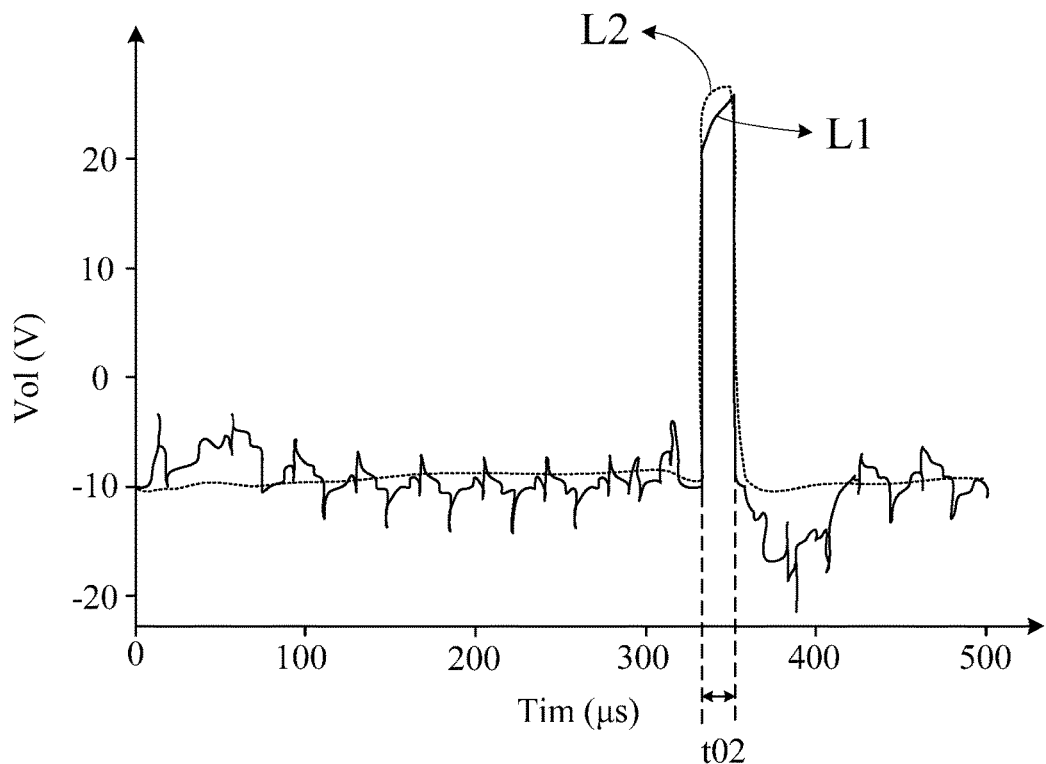
FIG. 3 is an analog simulation diagram of an output terminal COUT of a shift register shown in FIG. 1.

In addition, taking a shift register that has been used for 25000 h as an example, according to the signal time sequence diagram shown in FIG. 2, a signal output by the output terminal COUT of the shift register shown in FIG. 1 is tested, as shown in FIG. 3. Wherein, the abscissa represents time, and the ordinate represents the voltage output by the output terminal COUT. It may be seen from FIG. 3 that L1 represents a waveform of a voltage output by the output terminal COUT of the shift register that has been used for 25000 h, and L2 represents an ideal waveform of a voltage output by the output terminal COUT of the shift register that has been used for 25000 h. The comparison between L1 and L2 shows that the threshold voltage Vth of the transistor drifts greatly due to the increase in service time, making a signal output by the output terminal COUT unstable and producing a noise. It should be noted that the ideal waveform may refer to a voltage waveform in which the threshold voltage Vth of the transistor does not drift or the drift degree is negligible.

Figure 4:
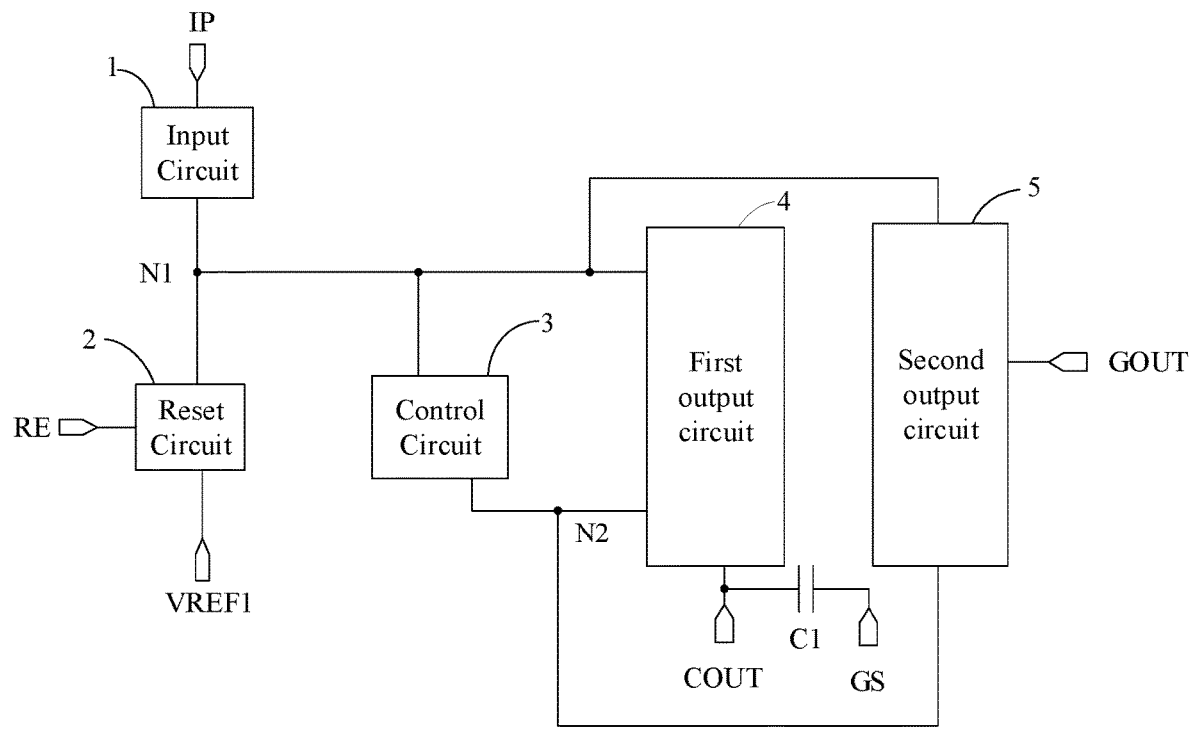
FIG. 4 is a structural diagram of a shift register according to an embodiment of the present disclosure.

Therefore, as shown in FIG. 4, the shift register provided by the embodiment of the present disclosure may include:
an input circuit 1, configured to, in response to a signal of an input signal terminal IP, supply the signal of the input signal terminal IP to a first node N1;
a rest circuit 2, configured to, in response to a signal of a reset signal terminal RE, supply a signal of a first reference signal terminal VREF1 to the first node N1;
a control circuit 3, configured to adjust a signal of the first node N1 and a signal of a second node N2;
a first output circuit 4, configured to output a signal from a cascade signal output terminal COUT according to the signal of the first node N1 and the signal of the second node N2;

a first capacitor C1, provided with a first terminal electrically connected to the cascade signal output terminal COUT, and a second terminal electrically connected to a fixed voltage signal terminal GS; and a second output circuit 5, configured to output a signal from a drive signal output terminal GOUT according to the signal of the first node N1 and the signal of the second node N2.

According to the shift register provided by the embodiment of the present disclosure, the first capacitor C1 is provided, with the first terminal electrically connected to the cascade signal output terminal COUT and the second terminal electrically connected to the fixed voltage signal terminal GS, so that a load capacitance of the cascade signal output terminal COUT is compensated, and the charging and discharging process of the first capacitor C1 is combined to reduce a noise of the signal of the cascade signal output terminal COUT and improve the signal stability of the cascade signal output terminal COUT.

In a specific implementation, according to an embodiment of the present disclosure, the second node N2 may include M second child nodes; the control circuit 3 includes M sub-control circuits; wherein the $m^{th}$ sub-control circuit of the M sub-control circuits corresponds to the $m^{th}$ second child node in the M second child nodes; M is an integer and M≥1, and m is an integer and 1≤m≤M;

the $m^{th}$ sub-control circuit is configured to adjust a signal of the $m^{th}$ second child node and the signal of the first node N1;

the first output circuit 4 is configured to output a signal from the cascade signal output terminal COUT according to the signal of the first node N1 and signals of the M second child nodes;

the second output circuit 5 is configured to output a signal from the drive signal output terminal GOUT according to the signal of the first node N1 and the signals of the M second child nodes.

Figure 5:
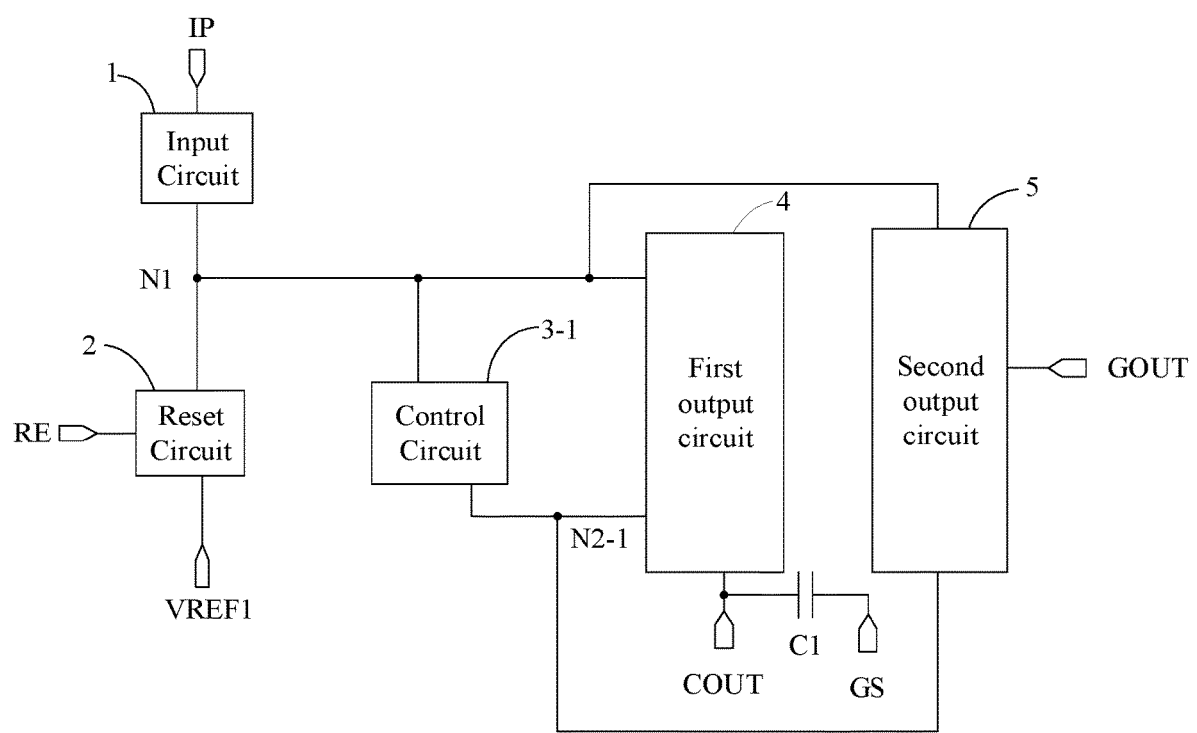
FIG. 5 is another structural diagram of a shift register according to an embodiment of the present disclosure.

Exemplarily, as shown in FIG. 5, M=1 may be made. Then, the second node N2 includes the first second child node N2-1. The control circuit 3 may include a first sub-control circuit 3-13-1 corresponding to the first second child node N2-1 one by one; wherein the first sub-control circuit 3-13-1 is configured to adjust the signal of the first second child node N2-1 and the signal of the first node N1. The first output circuit 4 is configured to output the signal from the cascade signal output terminal COUT according to the signal of the first node N1 and the signal of the first second child node N2-1. The second output circuit 5 is configured to output the signal from the drive signal output terminal GOUT according to the signal of the first node N1 and the signal of the first second child node N2-1. The following description takes M=1 as an example.

Figure 6:
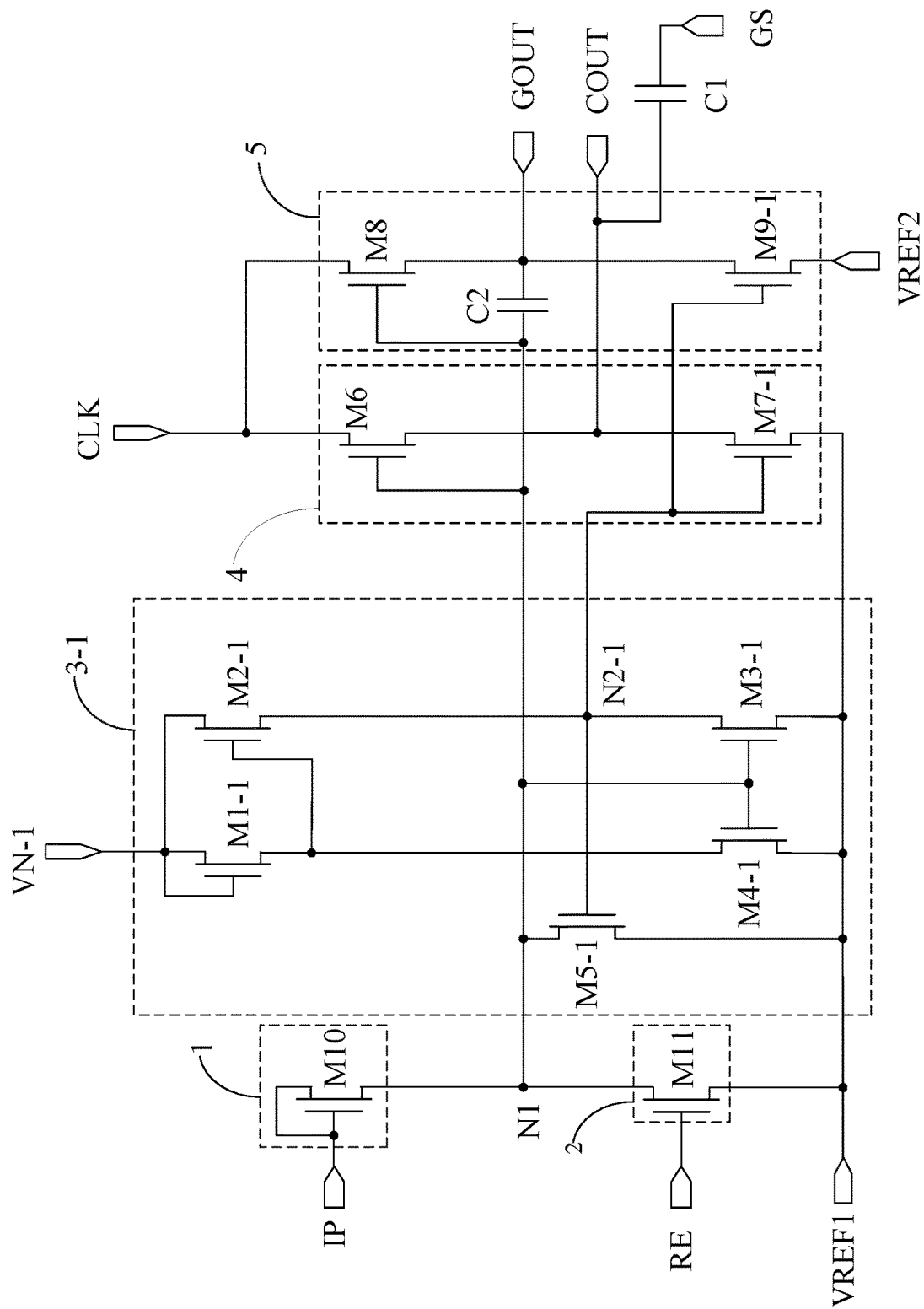
FIG. 6 is a specific structural diagram of a shift register according to an embodiment of the present disclosure.

In a specific implementation, according to an embodiment of the present disclosure, the first sub-control circuit 3-1 corresponds to a first selection control signal terminal VN-1 as shown in FIG. 6. The first sub-control circuit 3-1 may include a first first transistor M1-1, a first second transistor M2-1, a first third transistor M3-1, a first fourth transistor M4-1 and a first fifth transistor M5-1.

Both a control terminal and a first terminal of the first first transistor M1-1 are electrically connected to the first selection control signal terminal VN-1, and a second terminal of the first first transistor M1-1 is electrically connected to a control terminal of the first second transistor M2-1.

A first terminal of the first second transistor M2-1 is electrically connected to the first selection control signal terminal VN-1, and a second terminal of the first second transistor M2-1 is electrically connected to the first second child node N2-1.

A control terminal of the first third transistor M3-1 is electrically connected to the first node N1, a first terminal of the first third transistor M3-1 is electrically connected to the first reference signal terminal VREF1, and a second terminal of the first third transistor M3-1 is electrically connected to the first second child node N2-1.

A control terminal of the first fourth transistor M4-1 is electrically connected to the first node N1, a first terminal of the first fourth transistor M4-1 is electrically connected to the first reference signal terminal VREF1, and a second terminal of the first fourth transistor M4-1 is electrically connected to a control terminal of the first second transistor M2-1.

A control terminal of the first fifth transistor M5-1 is electrically connected to the first second child node N2-1, a first terminal of the first fifth transistor M5-1 is electrically connected to the first reference signal terminal VREF1, and a second terminal of the first fifth transistor M5-1 is electrically connected to the first node N1.

In a specific implementation, according to an embodiment of the present disclosure, as shown in FIG. 6, the first output circuit 4 may include a sixth transistor M6 and a first seventh transistor M7-1;

a control terminal of the sixth transistor M6 is electrically connected to the first node N1, a first terminal of the sixth transistor M6 is electrically connected to the clock signal terminal, and a second terminal of the sixth transistor M6 is electrically connected to the cascade signal output terminal COUT;

a control terminal of the first seventh transistor M7-1 is electrically connected to the first second child node N2-1, a first terminal of the first seventh transistor M7-1 is electrically connected to the first reference signal terminal VREF1, and a second terminal of the first seventh transistor M7-1 is electrically connected to the cascade signal output terminal COUT.

In a specific implementation, according to an embodiment of the present disclosure, the size range of the sixth transistor M6 may be 600 μm to 2000 μm. Exemplarily, the size of the sixth transistor M6 may be set to 600 μm. Alternatively, the size of the sixth transistor M6 may be set to 800 μm. Alternatively, the size of the sixth transistor M6 may be set to 1500 μm. Alternatively, the size of the sixth transistor M6 may be set to 1800 μm. Alternatively, the size of the sixth transistor M6 may be set to 2000 μm.

In a specific implementation, according to an embodiment of the present disclosure, the size range of the seventh transistor M7-1 may be 200 μm to 800 μm. Exemplarily, the size of the seventh transistor M7-1 may be set to 200 μm. Alternatively, the size of the seventh transistor M7-1 may be set to 400 μm. Alternatively, the size of the seventh transistor M7-1 may be set to 600 μm. Alternatively, the size of the seventh transistor M7-1 may be set to 800 μm. Of course, in practical application, the size of the seventh transistor M7-1 may be designed according to the practical application environment, and is not limited herein.

In a specific implementation, according to an embodiment of the present disclosure, the range of the capacitance value of the first capacitor C1 may be set to 5 pF to 15 pF. Exemplarily, the capacitance value of the first capacitor C1 may be set to 5 pF. Alternatively, the capacitance value of the first capacitor C1 may be set to 10 pF. Alternatively, the capacitance value of the first capacitor C1 may be set to 15 pF. In a specific implementation, the capacitance value of the first capacitor C1 may be designed according to the characteristics (e.g., transistor threshold voltage Vth) of the sixth transistor M6 and the seventh transistor M7-1, so that the output stability may be further improved by combining the first capacitor, the sixth transistor M6 and the seventh transistor M7-1.

In a specific implementation, according to an embodiment of the present disclosure, the second output circuit 5 may include an eighth transistor M8, a second capacitor C2 and a first ninth transistor M9-1 as shown in FIG. 6;

a control terminal of the eighth transistor M8 is electrically connected to the first node N1, a first terminal of the eighth transistor M8 is electrically connected to the clock signal terminal, and a second terminal of the eighth transistor M8 is electrically connected to the drive signal output terminal GOUT;

a first terminal of the second capacitor C2 is electrically connected to the first node N1, and a second terminal of the second capacitor C2 is electrically connected to the drive signal output terminal GOUT;

a control terminal of the first ninth transistor M9-1 is electrically connected to the first second child node N2-1, a first terminal of the first ninth transistor M9-1 is electrically connected to the second reference signal terminal, and a second terminal of the first ninth transistor M9-1 is electrically connected to the drive signal output terminal GOUT.

In a specific implementation, according to an embodiment of the present disclosure, as shown in FIG. 6, the input circuit 1 may include a tenth transistor M10; wherein a control terminal and a first terminal of the tenth transistor M10 are electrically connected to the input signal terminal IP, and a second terminal thereof is electrically connected to the first node N1.

In a specific implementation, according to an embodiment of the present disclosure, the reset circuit 2 may include an eleventh transistor M11 as shown in FIG. 6; wherein a control terminal of the eleventh transistor M11 is electrically connected to the reset signal terminal RE, and a second terminal of the eleventh transistor M11 is electrically connected to the first node N1.

In a specific implementation, according to an embodiment of the present disclosure, the fixed voltage signal terminal GS and the first reference signal terminal may be set as one same signal terminal to reduce the number of signal terminals, the difficulty of wiring and the cost.

In a specific implementation, according to an embodiment of the present disclosure, the fixed voltage signal terminal GS and the second reference signal terminal may also be set as one same signal terminal to reduce the number of signal terminals, the difficulty of wiring and the cost.

Of course, in a specific implementation, according to an embodiment of the present disclosure, the fixed voltage signal terminal GS and the ground terminal may be set as one same signal terminal, which is not limited herein.

The foregoing examples only illustrate the specific structure of the shift register provided by the embodiment of the present disclosure. In a specific implementation, the specific structure of each of the circuits is not limited to the above structure provided by the embodiment of the present disclosure, but may also be other structures known to a person skilled in the art, and is not limited herein.

To reduce the preparation process, in a specific implementation, in the shift register provided by the embodiment of the present disclosure, as shown in FIG. 6, all transistors may be N-type transistors. Moreover, a signal of the first selection control signal terminal VN-1 may be a high-level signal with a fixed voltage, a signal of the first reference signal terminal VREF1 may be a low-level signal, and a signal of the second reference signal terminal may also be a low-level signal. Wherein a voltage of a signal at the first reference signal terminal VREF1 may be made the same as a voltage of a signal at the second reference signal terminal, so that a voltage may be input to the first reference signal terminal VREF1 and the second reference signal terminal via one same signal terminal, thereby reducing the number of signal terminals and the difficulty of wiring. Alternatively, the voltage of the signal at the first reference signal terminal VREF1 may be made smaller than the voltage of the signal at the second reference signal terminal. In this way, TFTs in pixels in a display area of a display panel may be turned off as completely as possible. Of course, in practical implementation, all transistors may also be P-type transistors, which is not limited herein.

Further, in a specific implementation, in the shift register provided by the embodiment of the present disclosure, the N-type transistor is turned on under the action of a high-level signal and turned off under the action of a low-level signal; the P-type transistor is turned off by a high-level signal and turned on by a low-level signal.

It should be noted that the transistor mentioned in the embodiments of the present disclosure may be a thin film transistor (TFT) or a metal-oxide-semiconductor (MOS) field effect transistor, which are not limited herein. In a specific implementation, a control terminal of a transistor is used as a gate, a first terminal may be used as a source and a second terminal as a drain according to the different transistor types and input signals, or a first terminal may be used as a drain and a second terminal as a source, which are not specifically distinguished herein.

It should be noted that in the actual process, the identities in each of the above features are not completely the same due to the limitations of the process conditions or other factors, and there may be some deviations, so the identical relationships between the above features are within the scope of protection of the present disclosure as long as the above conditions are generally satisfied. For example, the above identities may be these allowed within the error allowable range.

The working process of the shift register provided by the embodiment of the present disclosure will be described in detail below by reference to the structure of the shift register shown in FIG. 6 as an example and in combination with the signal time sequence diagram shown in FIG. 7. In the following description, 1 represents a high-level signal and 0 represents a low-level signal, wherein 1 and 0 represent their logic levels, only to better explain the working process of the shift register provided by the embodiment of the present disclosure, but not the potential applied to the gates of each transistor during specific implementation.

In the input phase T1, IP=1, CLK=0, RE=0.

Since RE=0, the eleventh transistor M11 is turned off. Since IP=1, the tenth transistor M10 is turned on to supply a high-level signal of the input signal terminal IP to the first node N1, which makes the first node N1 be provided with a high-level signal, and controls the first third transistor M3-1, the first fourth transistor M4-1, the sixth transistor M6 and the eighth transistor M8 to be turned on. The turned-on first fourth transistor M4-1 may supply a low-level signal of the first reference signal terminal VREF1 to the gate of the first second transistor M2-1 to control the first second transistor M2-1 to be turned off. The turned-on first third transistor M3-1 may supply a low-level signal of the first reference signal terminal VREF1 to the first second child node N2-1 to make the first second child node N2-1 be provided with a low-level signal and control the first fifth transistor M5-1, the first seventh transistor M7-1 and the first ninth transistor M9-1 to be turned off. The turned-on sixth transistor M6 may supply a low-level signal of the clock signal terminal CLK to the cascade signal output terminal COUT, and stabilize the voltage through the first capacitor C1, so that the cascade signal output terminal COUT outputs a low-level signal. The turned-on eighth transistor M8 may supply a low-level signal of the clock signal terminal CLK to the drive signal output terminal GOUT, so that the drive signal output terminal GOUT outputs a low-level signal.

In the output phase T2, IP=0, CLK=1, RE=0.

Since RE=0, the eleventh transistor M11 is turned off. Since IP=0, the tenth transistor M10 is turned off. Therefore, the first node N1 is in a floating state. The first node N1 is kept with a high-level signal under the action of the second capacitor C2. When the first node N1 is provided with a high-level signal, the first third transistor M3-1, the first fourth transistor M4-1, the sixth transistor M6 and the eighth transistor M8 are controlled to be turned on. The turned-on first fourth transistor M4-1 may supply a low-level signal of the first reference signal terminal VREF1 to the gate of the first second transistor M2-1 to control the first second transistor M2-1 to be turned off. The turned-on first third transistor M3-1 may supply a low-level signal of the first reference signal terminal VREF1 to the first second child node N2-1 to make the first second child node N2-1 be provided with a low-level signal and control the first fifth transistor M5-1, the first seventh transistor M7-1 and the first ninth transistor M9-1 to be turned off. The turned-on sixth transistor M6 may supply a high-level signal of the clock signal terminal to the cascade signal output terminal COUT, and stabilize the voltage through the first capacitor C1, so that the cascade signal output terminal COUT outputs a high-level signal. The turned-on eighth transistor M8 may supply a high-level signal from the clock signal terminal to the drive signal output terminal GOUT. The first node N1 is in a floating state, and the voltage of the first node N1 is further raised to cause the eighth transistor M8 to be turned on as completely as possible. In this case, the high-level signal of the clock signal terminal may be supplied to the drive signal output terminal GOUT without a voltage loss as much as possible, so that the drive signal output terminal GOUT may output a high-level signal.

In the reset phase T3, IP=0, CLK=0 and RE=1.

Since IP=0, the tenth transistor M10 is turned off. Since RE=1, the eleventh transistor M11 is turned on and a low-level signal of the first reference signal terminal VREF1 is supplied to the first node N1, which makes the first node N1 be provided with a low-level signal, and thus controls the first third transistor M3-1, the first fourth transistor M4-1, the sixth transistor M6 and the eighth transistor M8 to be turned off. The first first transistor M1-1 is turned on under the control of a high-level signal of the first selection control signal terminal VN-1, so as to supply a high-level signal of the first selection control signal terminal VN-1 to the gate of the first second transistor M2-1, and thus control the first second transistor M2-1 to be turned on.

The turned-on first second transistor M2-1 may supply a high-level signal of the first selection control signal terminal VN-1 to the first second child node N2-1, so that the first fifth transistor M5-1, the first seventh transistor M7-1 and the first ninth transistor M9-1 are all turned on. The turned-on first fifth transistor M5-1 may supply a low-level signal of the first reference signal terminal VREF1 to the first node N1, making the first node N1 be further provided with a low-level signal. The turned-on first seventh transistor M7-1 may supply a low-level signal of the first reference signal terminal VREF1 to the cascade signal output terminal COUT, and stabilize the voltage by the first capacitor C1, so that the cascade signal output terminal COUT outputs a low-level signal. The turned-on first ninth transistor M9-1 may supply a low-level signal of the first reference signal terminal VREF1 to the drive signal output terminal GOUT, so that the drive signal output terminal GOUT outputs a low-level signal.

Figure 7:
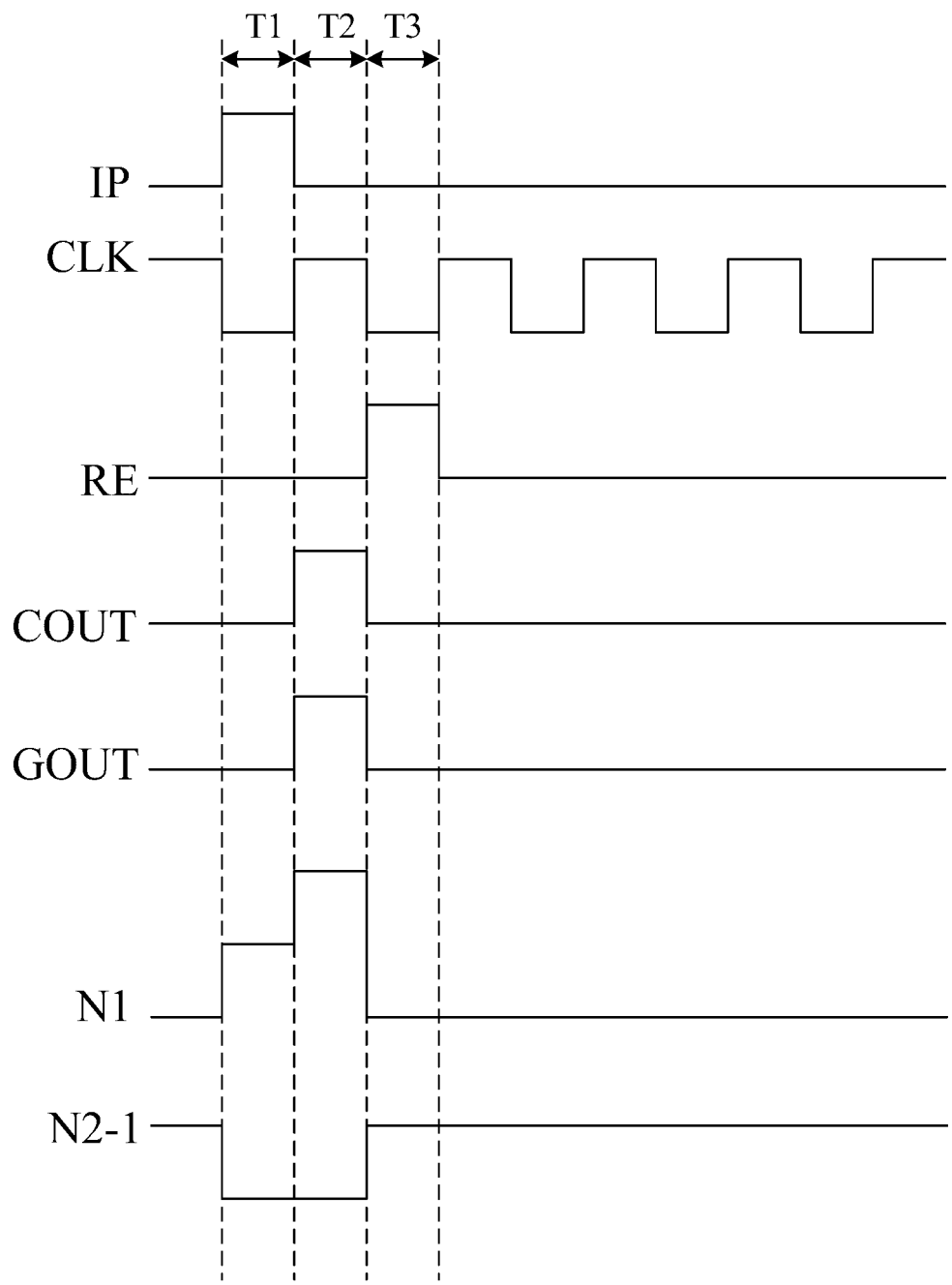
FIG. 7 is a signal time sequence diagram of the shift register shown in FIG. 6.
Figure 8:
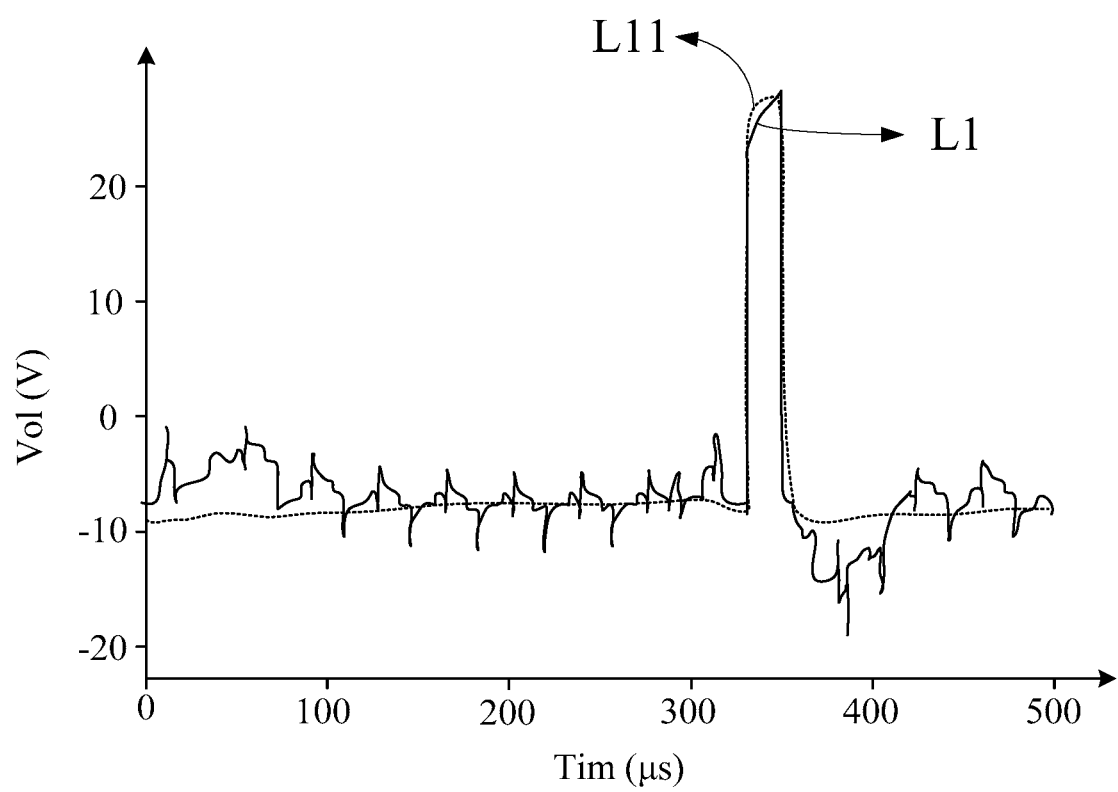
FIG. 8 is an analog simulation diagram of a cascade signal output terminal of a shift register shown in FIG. 6.

In addition, taking a shift register that has been used for 25000 h as an example, according to the signal time sequence diagram shown in FIG. 7, a signal output by the cascade signal output terminal of the shift register shown in FIG. 6 is tested, as shown in FIG. 8. Wherein, the abscissa represents time, and the ordinate represents the voltage output by the cascade signal output terminal. L1 represents a voltage output by the output terminal COUT of the shift register that has been used for 25000 h shown in FIG. 2, and L11 represents a voltage output by the cascade signal output terminal COUT of the shift register that has been used for 25000 h shown in FIG. 6. In combination with FIG. 8, and by comparing L11 with L1, the first capacitor C1 is set in the embodiment of the present disclosure to compensate the load capacitance of the cascade signal output terminal COUT, and the charging and discharging process of the first capacitor C1 is combined to reduce a noise of the signal of the cascade signal output terminal COUT and improve the signal stability of the cascade signal output terminal COUT.

Figure 9:
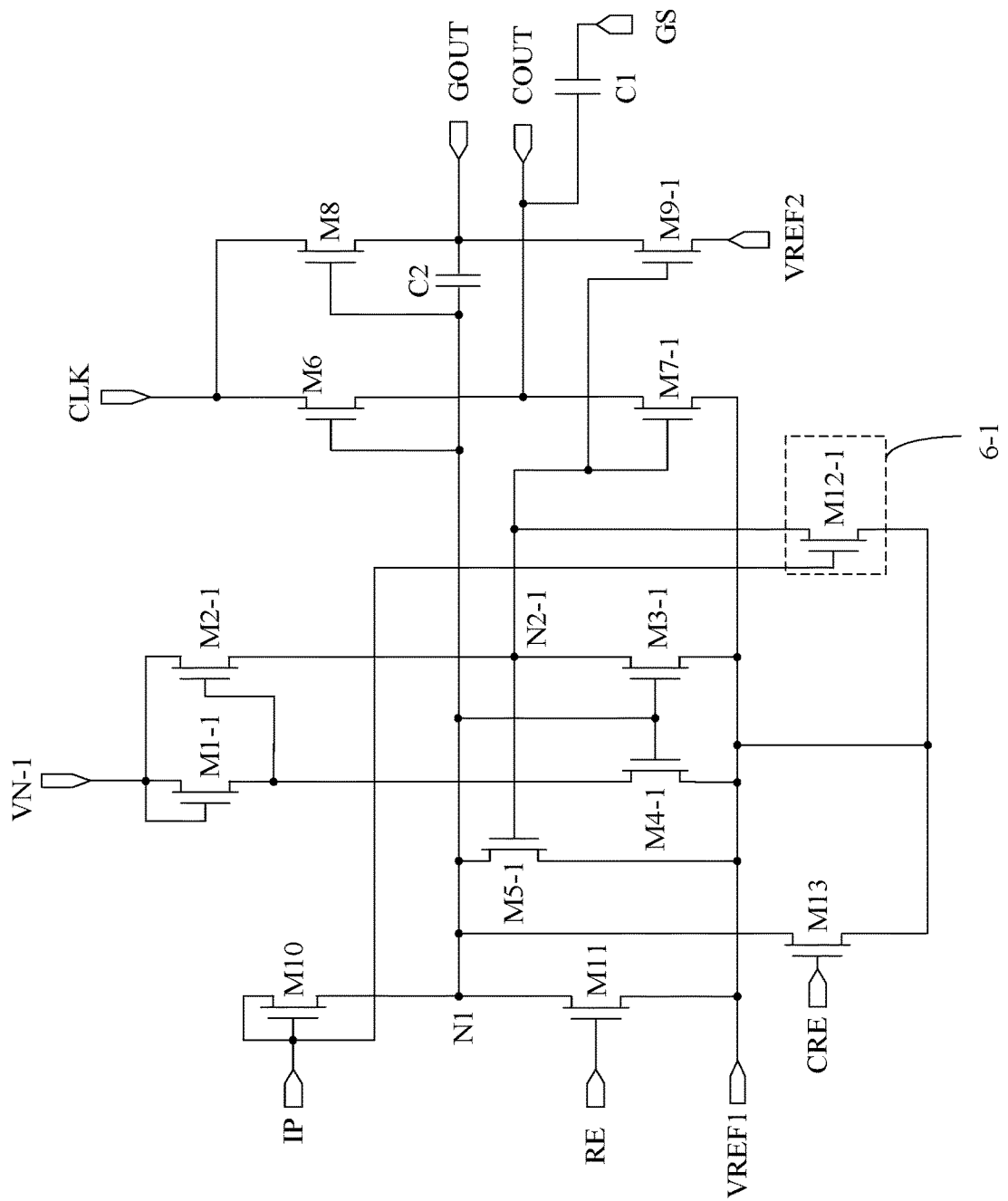
FIG. 9 is another specific structural diagram of a shift register according to an embodiment of the present disclosure.

The embodiment of the present disclosure also provides some structural schematic diagrams of shift registers, as shown in FIG. 9, which are modified with respect to the implementation of the above embodiments. Only the differences between this embodiment and the above embodiments will be explained below, and the similarities will not be repeated herein.

In a specific implementation, according to an embodiment of the present disclosure, the shift register may also include M node voltage regulator circuits; wherein the $m^{th}$ node voltage regulator circuit of the M node voltage regulator circuits corresponds to the $m^{th}$ second child node; and, the $m^{th}$ node voltage regulator circuit is configured to supply a signal of the first reference signal terminal VREF1 to the $m^{th}$ second child node in response to a signal of the input signal terminal IP. Exemplarily, the $m^{th}$ node voltage regulator circuit includes an $m^{th}$ twelfth transistor; wherein a control terminal of the $m^{th}$ twelfth transistor is electrically connected to the input signal terminal IP, a first terminal of the $m^{th}$ twelfth transistor is electrically connected to the first reference signal terminal VREF1, and a second terminal of the $m^{th}$ twelfth transistor is electrically connected to the $m^{th}$ second child node. In this way, a signal of the $m^{th}$ second child node may be further stabilized.

Exemplarily, M=1 may be made. According to an embodiment of the present disclosure, as shown in FIG. 9, the shift register further includes a node voltage regulator circuit; wherein a first node voltage regulator circuit 6-1 corresponds to the first second child node N2-1. Furthermore, the first node voltage regulator circuit 6-1 is configured to supply a signal of the first reference signal terminal VREF1 to the first second child node N2-1 in response to a signal of the input signal terminal IP.

Exemplarily, as shown in FIG. 9, the first node voltage regulator circuit 6-1 may include a first twelfth transistor M12-1; wherein a control terminal of the first twelfth transistor M12-1 is electrically connected to the input signal terminal IP, a first terminal of the first twelfth transistor M12-1 is electrically connected to the first reference signal terminal VREF1, and the second terminal of the first twelfth transistor M12-1 is electrically connected to the first second child node N2-1.

Further, in a specific implementation, as shown in FIG. 9, the shift register may further include a thirteenth transistor M13; wherein a control terminal of the thirteenth transistor M13 is electrically connected to the initial reset signal terminal RE, a first terminal of the thirteenth transistor M13 is electrically connected to the first reference signal terminal VREF1, and a second terminal of the thirteenth transistor M13 is electrically connected to the first node N1.

The foregoing examples only illustrate the specific structure of the shift register provided by the embodiment of the present disclosure. In a specific implementation, the specific structure of each of the circuits is not limited to the above structure provided by the embodiment of the present disclosure, but may also be other structures known to a person skilled in the art, and is not limited herein.

Figure 10:
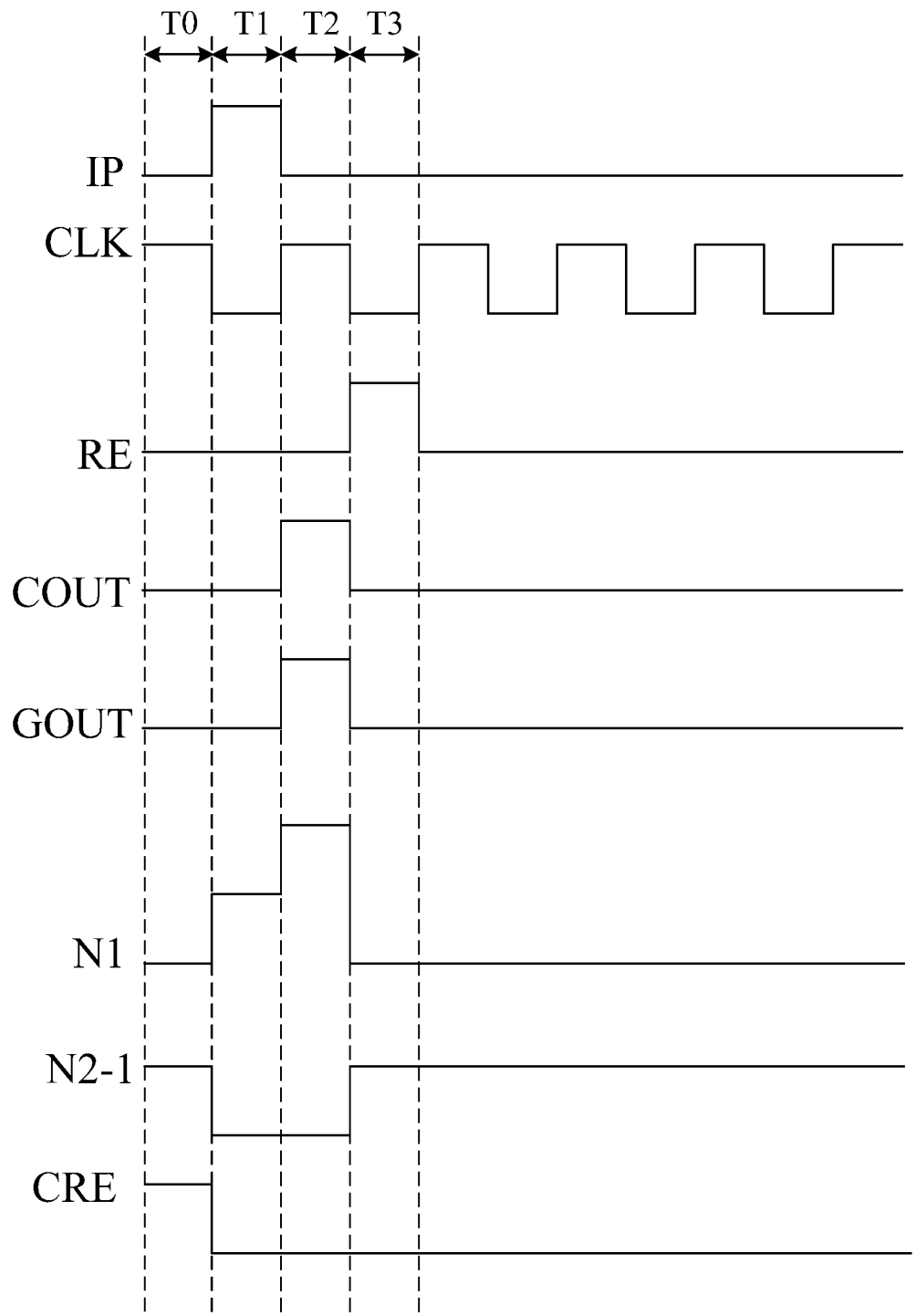
FIG. 10 is a signal time sequence diagram of the shift register shown in FIG. 9.

The working process of the shift register provided by the embodiment of the present disclosure will be described below by reference to the structure of the shift register shown in FIG. 9 as an example and in combination with the signal time sequence diagram shown in FIG. 10. The working process corresponding to this embodiment is partially the same as that of the shift register shown in FIG. 6, and only the different contents of the working process will be described below.

A frame reset phase T0 may also be set before the input phase T1. In the frame reset phase T0, the initial reset signal terminal RE is provided with a high-level signal to control the thirteenth transistor M13 to be turned on, with the purpose of supplying a low-level signal of the first reference signal terminal VREF1 to the first node N1. Then, the first node N1 may be pre-set to further reduce the noise of the cascade signal output terminal COUT.

In the input phase T1, the first twelfth transistor M12-1 is turned on under the control of a high-level signal of the input signal terminal IP, so as to supply a low-level signal of the first reference signal terminal to the first second child node N2-1. Thus, the first second child node N2-1 is provided the low-level signal to further reduce the noise of the cascade signal output terminal COUT.

Figure 11:
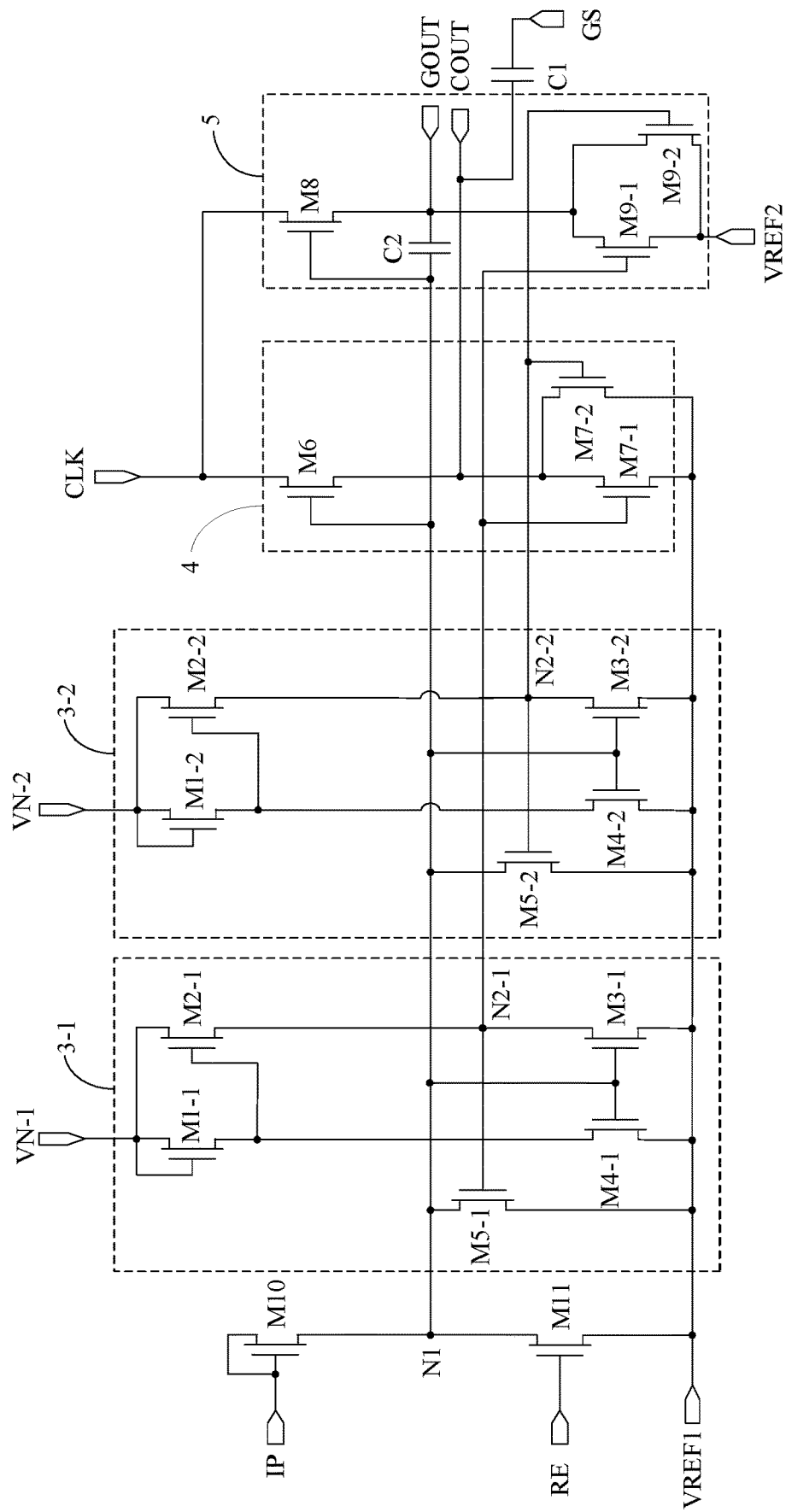
FIG. 11 is a schematic diagram of some specific structures of a shift register according to an embodiment of the present disclosure.

The embodiment of the present disclosure also provides some structural schematic diagrams of shift registers, as shown in FIG. 11, which are modified with respect to the implementation of the above embodiments. Only the differences between this embodiment and the above embodiments will be explained below, and the similarities will not be repeated herein.

Exemplarily, in a specific implementation, according to an embodiment of the present disclosure, as shown in FIG. 11, M=2 is made. Then, the second node N2 may include the first second child node N2-1 and the second second child node N2-2. The control circuit 3 may include a first sub-control circuit 3-1 corresponding to the first second child node N2-1 and a second sub-control circuit 3-2 corresponding to the second second child node N2-2; wherein the first sub-control circuit 3-1 is configured to adjust signals of the first second child node N2-1 and the first node N1. The second sub-control circuit 3-2 is configured to adjust signals of the second second child node N2-2 and the first node N1. The first output circuit 4 is configured to output a signal from the cascade signal output terminal COUT according to signals of the first node N1, the first second child node N2-1 and the second second child node N2-2. The second output circuit 5 is configured to output a signal from the drive signal output terminal GOUT according to signals of the first node N1, the first second child node N2-1 and the second second child node N2-2. In a specific implementation, M=3, M=4 or M=5 may be made. The specific value of M may be designed according to the actual application environment and will not be limited herein. The following description takes M=2 as an example.

In a specific implementation, according to an embodiment of the present disclosure, the first sub-control circuit 3-1 corresponds to the first selection control signal terminal VN-1 as shown in FIG. 11. The first sub-control circuit 3-1 may include a first first transistor M1-1, a first second transistor M2-1, a first third transistor M3-1, a first fourth transistor M4-1 and a first fifth transistor M5-1.

Both a control terminal and a first terminal of the first first transistor M1-1 are electrically connected to the first selection control signal terminal VN-1, and a second terminal of the first first transistor M1-1 is electrically connected to a control terminal of the first second transistor M2-1.

A first terminal of the first second transistor M2-1 is electrically connected to the first selection control signal terminal VN-1, and a second terminal of the first second transistor M2-1 is electrically connected to the first second child node N2-1.

A control terminal of the first third transistor M3-1 is electrically connected to the first node N1, a first terminal of the first third transistor M3-1 is electrically connected to the first reference signal terminal VREF1, and a second terminal of the first third transistor M3-1 is electrically connected to the first second child node N2-1.

A control terminal of the first fourth transistor M4-1 is electrically connected to the first node N1, a first terminal of the first fourth transistor M4-1 is electrically connected to the first reference signal terminal VREF1, and a second terminal of the first fourth transistor M4-1 is electrically connected to a control terminal of the first second transistor M2-1.

A control terminal of the first fifth transistor M5-1 is electrically connected to the first second child node N2-1, a first terminal of the first fifth transistor M5-1 is electrically connected to the first reference signal terminal VREF1, and a second terminal of the first fifth transistor M5-1 is electrically connected to the first node N1.

In a specific implementation, according to an embodiment of the present disclosure, as shown in FIG. 11, the second sub-control circuit 3-2 corresponds to the second selection control signal terminal VN-2. The second sub-control circuit 3-2 may include a second first transistor M1-2, a second second transistor M2-2, a second third transistor M3-2, a second fourth transistor M4-2 and a second fifth transistor M5-2.

Both a control terminal and a first terminal of the second first transistor M1-2 are electrically connected to the second selection control signal terminal VN-2, and a second terminal of the second first transistor M1-2 is electrically connected to a control terminal of the second second transistor M2-2;

a first terminal of the second second transistor M2-2 is electrically connected to the second selection control signal terminal VN-2, and a second terminal of the second second transistor M2-2 is electrically connected to the second second child node N2-2;

a control terminal of the second third transistor M3-2 is electrically connected to the first node N1, a first terminal of the second third transistor M3-2 is electrically connected to the first reference signal terminal VREF1, and a second terminal of the second third transistor M3-2 is electrically connected to the second second child node N2-2;

a control terminal of the second fourth transistor M4-2 is electrically connected to the first node N1, a first terminal of the second fourth transistor M4-2 is electrically connected to the first reference signal terminal VREF1, and a second terminal of the second fourth transistor M4-2 is electrically connected to a control terminal of the second second transistor M2-2; and a control terminal of the second fifth transistor M5-2 is electrically connected to the second second child node N2-2, a first terminal of the second fifth transistor M5-2 is electrically connected to the first reference signal terminal VREF1, and a second terminal of the second fifth transistor M5-2 is electrically connected to the first node N1.

In a specific implementation, according to an embodiment of the present disclosure, the first output circuit 4 may include a sixth transistor M6, a first seventh transistor M7-1 and a second seventh transistor M7-2 as shown in FIG. 11;

a control terminal of the sixth transistor M6 is electrically connected to the first node N1, a first terminal of the sixth transistor M6 is electrically connected to the clock signal terminal, and a second terminal of the sixth transistor M6 is electrically connected to the cascade signal output terminal COUT;

a control terminal of the first seventh transistor M7-1 is electrically connected to the first second child node N2-1, a first terminal of the first seventh transistor M7-1 is electrically connected to the first reference signal terminal VREF1, and a second terminal of the first seventh transistor M7-1 is electrically connected to the cascade signal output terminal COUT; and a control terminal of the second seventh transistor M7-2 is electrically connected to the second second child node N2-2, a first terminal of the second seventh transistor M7-2 is electrically connected to the first reference signal terminal VREF1, and a second terminal of the second seventh transistor M7-2 is electrically connected to the cascade signal output terminal COUT.

In a specific implementation, according to an embodiment of the present disclosure, the size range of the seventh transistor M7-1 may be 200 μm to 800 μm. Exemplarily, the size of the seventh transistor M7-1 may be set to 200 μm. Alternatively, the size of the seventh transistor M7-1 may be set to 400 μm. Alternatively, the size of the seventh transistor M7-1 may be set to 600 μm. Alternatively, the size of the seventh transistor M7-1 may be set to 800 μm.

In a specific implementation, according to an embodiment of the present disclosure, the size range of the seventh transistor M7-2 may be 200 μm to 800 μm. Exemplarily, the size of the seventh transistor M7-2 may be set to 200 μm. Alternatively, the size of the seventh transistor M7-2 may be set to 400 μm. Alternatively, the size of the seventh transistor M7-2 may be set to 600 μm. Alternatively, the size of the seventh transistor M7-2 may be set to 800 μm.

In a specific implementation, according to an embodiment of the present disclosure, the size of the seventh transistor M7-1 may be set to be the same as that of the seventh transistor M7-2, so that the seventh transistor M7-1 and the seventh transistor M7-2 may be designed uniformly.

In a specific implementation, according to an embodiment of the present disclosure, the range of the capacitance value of the first capacitor C1 may be set to 5 pF to 15 pF. Exemplarily, the capacitance value of the first capacitor C1 may be set to 5 pF. Alternatively, the capacitance value of the first capacitor C1 may be set to 10 pF. Alternatively, the capacitance value of the first capacitor C1 may be set to 15 pF. In a specific implementation, the capacitance value of the first capacitor C1 may be designed according to the characteristics (e.g., transistor threshold voltage Vth) of the sixth transistor M6 and the seventh transistor M7-1 and M7-2, so that the output stability may be further improved by combining the first capacitor, the sixth transistor M6 and the seventh transistors M7-1 and M7-2.

In a specific implementation, according to an embodiment of the present disclosure, the second output circuit 5 may include an eighth transistor M8, a second capacitor C2, a first ninth transistor M9-1, and a second ninth transistor M9-2 as shown in FIG. 11;

a control terminal of the eighth transistor M8 is electrically connected to the first node N1, a first terminal of the eighth transistor M8 is electrically connected to the clock signal terminal, and a second terminal of the eighth transistor M8 is electrically connected to the drive signal output terminal GOUT;

a first terminal of the second capacitor C2 is electrically connected to the first node N1, and a second terminal of the second capacitor C2 is electrically connected to the drive signal output terminal GOUT;

a control terminal of the first ninth transistor M9-1 is electrically connected to the first second child node N2-1, a first terminal of the first ninth transistor M9-1 is electrically connected to the second reference signal terminal, and a second terminal of the first ninth transistor M9-1 is electrically connected to the drive signal output terminal GOUT; and a control terminal of the second ninth transistor M9-2 is electrically connected to the second second child node N2-2, a first terminal of the second ninth transistor M9-2 is electrically connected to the second reference signal terminal, and a second terminal of the second ninth transistor M9-2 is electrically connected to the drive signal output terminal GOUT.

The foregoing examples only illustrate the specific structure of the shift register provided by the embodiment of the present disclosure. In a specific implementation, the specific structure of each of the circuits is not limited to the above structure provided by the embodiment of the present disclosure, but may also be other structures known to a person skilled in the art, and is not limited herein.

To reduce the preparation process, in a specific implementation, in the shift register provided by the embodiment of the present disclosure, as shown in FIG. 11, all transistors may be N-type transistors. Moreover, a signal of the first reference signal terminal VREF1 may be a low-level signal, and a signal of the second reference signal terminal may also be a low-level signal. Wherein a voltage of a signal at the first reference signal terminal VREF1 may be made the same as a voltage of a signal at the second reference signal terminal, so that a voltage may be input to the first reference signal terminal VREF1 and the second reference signal terminal via one same signal terminal, thereby reducing the number of signal terminals and the difficulty of wiring. Alternatively, the voltage of the signal at the first reference signal terminal VREF1 may be made smaller than the voltage of the signal at the second reference signal terminal. In this way, TFTs in pixels in a display area of a display panel may be turned off as completely as possible. Of course, in practical implementation, all transistors may also be P-type transistors, which is not limited herein.

Figure 12A:
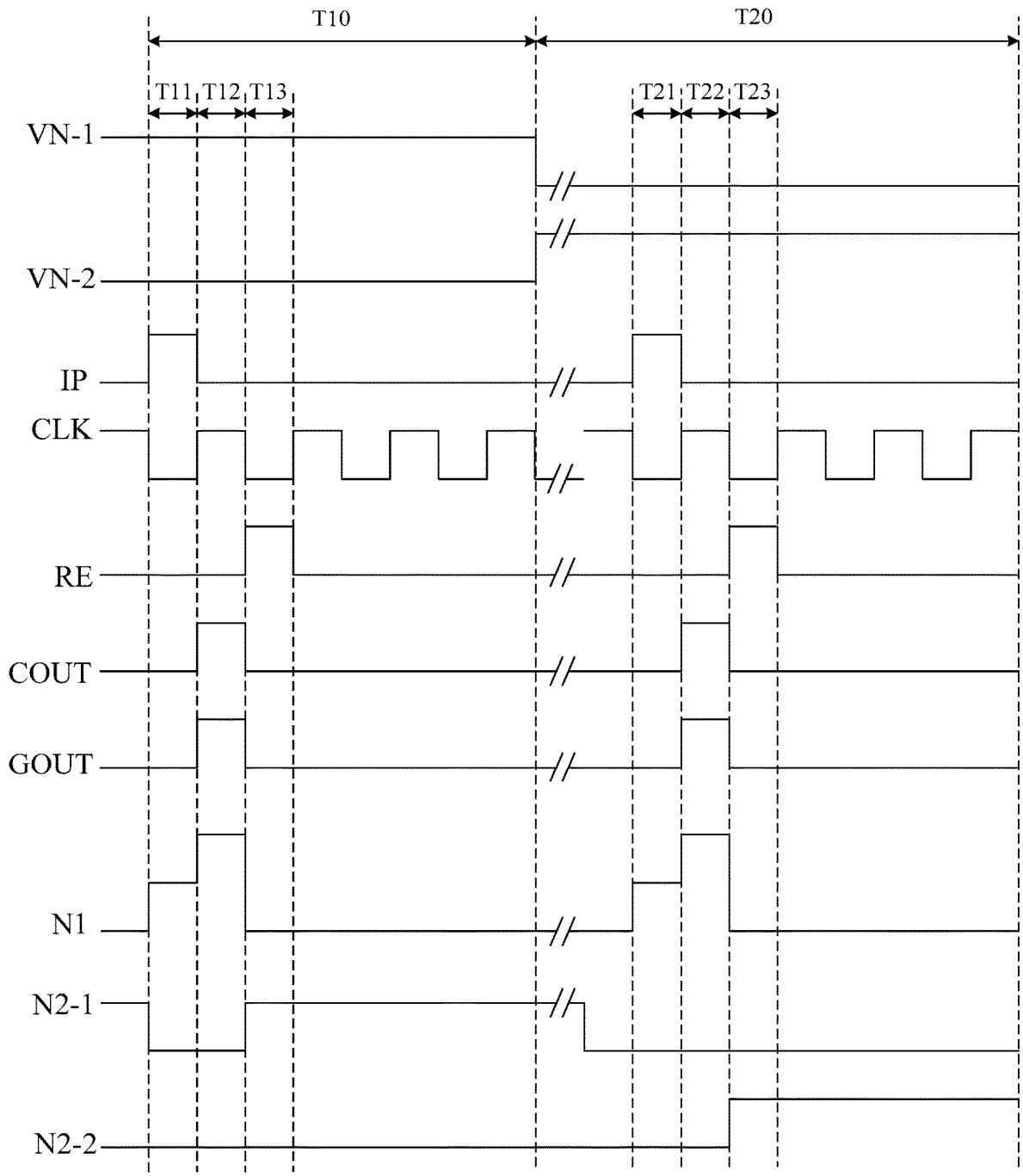
FIG. 12A is a signal time sequence diagram of the shift register shown in FIG. 11.

In a specific implementation, a signal of the first selection control signal terminal VN-1 and a signal of the second selection control signal terminal VN-2 may be pulse signals switched between a high level and a low level respectively, and the level of the first selection control signal terminal VN-1 is opposite to that of the second selection control signal terminal VN-2. For example, as shown in FIG. 12A, in the T10 phase, the first selection control signal terminal VN-1 is provided with a high-level signal, and the second selection control signal terminal VN-2 is provided with a low-level signal. In the T20 phase, the first selection control signal terminal VN-1 is provided with a low-level signal, and the second selection control signal terminal VN-2 is provided with a high-level signal. Exemplarily, the maintenance duration of the T10 phase may be made the same as that of the T20 phase. For example, the maintenance durations of T10 phase and T20 phase are set as the duration of one display frame, the duration of multiple display frames, 2 s, 1 h or 24 h, which are not limited herein.

Figure 12B:
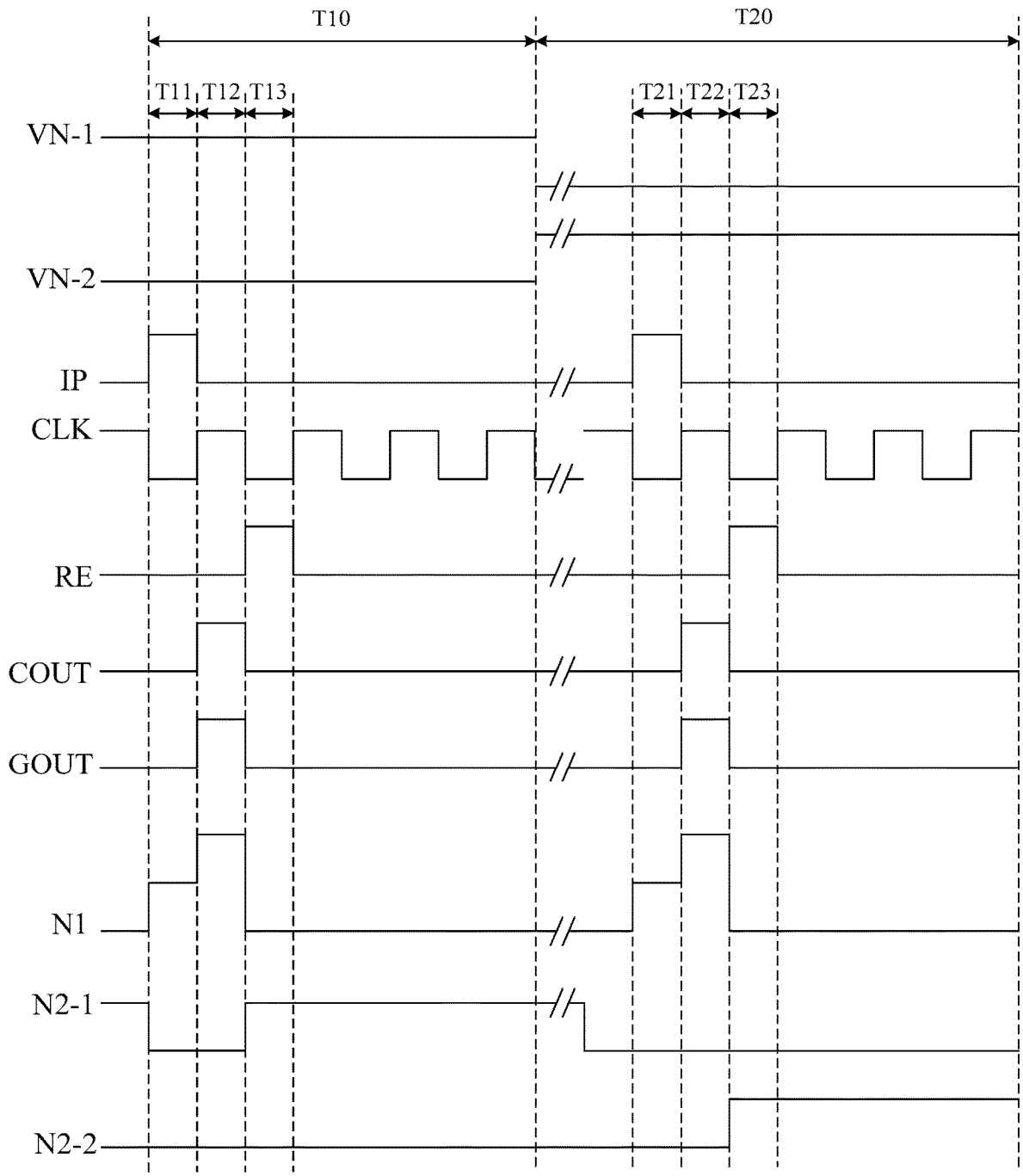
FIG. 12B is another signal time sequence diagram of the shift register shown in FIG. 11.

In a specific implementation, a signal of the first selection control signal terminal VN-1 and a signal of the second selection control signal terminal VN-2 may also be DC signals respectively. Furthermore, when the first selection control signal terminal VN-1 is loaded with a high-level DC signal, the second selection control signal terminal VN-2 is not loaded with a signal or is loaded with a low-level DC signal. When the second selection control signal terminal VN-2 is loaded with a high-level DC signal, the first selection control signal terminal VN-1 is not loaded with a signal or is loaded with a low-level DC signal. For example, as shown in FIG. 12B, in the T10 phase, the first selection control signal terminal VN-1 is provided with a high-level DC signal, and the second selection control signal terminal VN-2 is provided with a low-level DC signal. In the T20 phase, the first selection control signal terminal VN-1 is provided with a low-level DC signal, and the second selection control signal terminal VN-2 is provided with a high-level DC signal. Exemplarily, the maintenance duration of the T10 phase may be made the same as that of the T20 phase. For example, the maintenance durations of T10 phase and T20 phase are set as the duration of one display frame, the duration of multiple display frames, 2 s, 1 h or 24 h, which are not limited herein.

Wherein, T10 phase and T20 phase may be prioritized according to the actual application. For example, the working process in T10 phase may be executed firstly, and then the working process in T20 phase may be executed. Alternatively, the working process in the T20 phase may be executed firstly, and then the working process in the T10 phase may be executed.

The working process of the shift register provided by the embodiment of the present disclosure will be described in detail below by reference to the structure of the shift register shown in FIG. 11 as an example and in combination with the signal time sequence diagram shown in FIG. 12A. In the following description, 1 represents a high-level signal and 0 represents a low-level signal, wherein 1 and 0 represent their logic levels, only to better explain the working process of the shift register provided by the embodiment of the present disclosure, but not the potential applied to the gates of each transistor during specific implementation.

Wherein, the T10 phase and the T20 phase in the signal time sequence diagram shown in FIG. 12A are selected. Moreover, an input phase T11, a reset phase T12, and an output phase T13 in the T10 phase are selected. In addition, an input phase T21, a reset phase T22 and an output phase T23 in the T20 phase are also selected.

In the T10 phase, since the second selection control signal terminal VN-2 is provided with a low-level signal, the second first transistor M1-2 is turned off.

In the input phase T11, IP=1, CLK=0, RE=0.

Since RE=0, the eleventh transistor M11 is turned off. Since IP=1, the tenth transistor M10 is turned on to supply a high-level signal of the input signal terminal IP to the first node N1, which makes the first node N1 be provided with a high-level signal, and controls the first third transistor M3-1, the first fourth transistor M4-1, the second third transistor M3-2, the second fourth transistor M4-2, the sixth transistor M6 and the eighth transistor M8 to be turned on. The turned-on first fourth transistor M4-1 may supply a low-level signal of the first reference signal terminal VREF1 to the gate of the first second transistor M2-1 to control the first second transistor M2-1 to be turned off. The turned-on first third transistor M3-1 may supply the low-level signal of the first reference signal terminal VREF1 to the first second child node N2-1 to make the first second child node N2-1 be provided with a low-level signal and control the first fifth transistor M5-1, the first seventh transistor M7-1 and the first ninth transistor M9-1 to be turned off. The turned-on second fourth transistor M4-2 may supply the low-level signal of the first reference signal terminal VREF1 to the gate of the second second transistor M2-2 to control the second second transistor M2-2 to be turned off. The turned-on second third transistor M3-2 may supply the low-level signal of the first reference signal terminal VREF1 to the second second child node N2-2 to make the second second child node N2-2 be provided with a low-level signal and control the second fifth transistor M5-2, the second seventh transistor M7-2 and the second ninth transistor M9-2 to be turned off.

The turned-on sixth transistor M6 may supply a low-level signal of the clock signal terminal CLK to the cascade signal output terminal COUT, and stabilize the voltage through the first capacitor C1, so that the cascade signal output terminal COUT outputs a low-level signal. The turned-on eighth transistor M8 may supply a low-level signal of the clock signal terminal CLK to the drive signal output terminal GOUT, so that the drive signal output terminal GOUT outputs a low-level signal.

In the output phase T12, IP=0, CLK=1, RE=0.

Since RE=0, the eleventh transistor M11 is turned off. Since IP=0, the tenth transistor M10 is turned off. Therefore, the first node N1 is in a floating state. The first node N1 is kept with a high-level signal under the action of the second capacitor C2. When the first node N1 is provided with a high-level signal, the first third transistor M3-1, the first fourth transistor M4-1, the second third transistor M3-2, the second fourth transistor M4-2, the sixth transistor M6 and the eighth transistor M8 are controlled to be turned on. The turned-on first fourth transistor M4-1 may supply the low-level signal of the first reference signal terminal VREF1 to the gate of the first second transistor M2-1 to control the first second transistor M2-1 to be turned off. The turned-on first third transistor M3-1 may supply the low-level signal of the first reference signal terminal VREF1 to the first second child node N2-1 to make the first second child node N2-1 be provided with a low-level signal and control the first fifth transistor M5-1, the first seventh transistor M7-1 and the first ninth transistor M9-1 to be turned off. The turned-on second fourth transistor M4-2 may supply the low-level signal of the first reference signal terminal VREF1 to the gate of the second second transistor M2-2 to control the second second transistor M2-2 to be turned off. The turned-on second third transistor M3-2 may supply the low-level signal of the first reference signal terminal VREF1 to the second second child node N2-2 to make the second second child node N2-2 be provided with a low-level signal and control the second fifth transistor M5-2, the second seventh transistor M7-2 and the second ninth transistor M9-2 to be turned off.

The turned-on sixth transistor M6 may supply a high-level signal of the clock signal terminal to the cascade signal output terminal COUT, and stabilize the voltage through the first capacitor C1, so that the cascade signal output terminal COUT outputs a high-level signal. The turned-on eighth transistor M8 may supply the high-level signal from the clock signal terminal to the drive signal output terminal GOUT. The first node N1 is in a floating state and the voltage of the first node N1 is further raised to cause the eighth transistor M8 to be turned on as completely as possible. In this case, the high-level signal of the clock signal terminal may be supplied to the drive signal output terminal GOUT without a voltage loss as much as possible, so that the drive signal output terminal GOUT may output a high-level signal.

In the reset phase T13, IP=0, CLK=0 and RE=1.

Since IP=0, the tenth transistor M10 is turned off. Since IP=1, the eleventh transistor M11 is turned on to supply a low-level signal of the first reference signal terminal VREF1 to the first node N1, which makes the first node N1 be provided with a low-level signal, and controls the first third transistor M3-1, the first fourth transistor M4-1, the second third transistor M3-2, the second fourth transistor M4-2, the sixth transistor M6 and the eighth transistor M8 to be turned off. In addition, the second second child node N2-2 is kept with a low-level signal to control the second fifth transistor M5-2, the second seventh transistor M7-2 and the second ninth transistor M9-2 to be turned off.

The first first transistor M1-1 is turned on under the control of a high-level signal of the first selection control signal terminal VN-1, so as to supply a high-level signal of the first selection control signal terminal VN-1 to the gate of the first second transistor M2-1, and thus control the first second transistor M2-1 to be turned on. The turned-on first second transistor M2-1 may supply the high-level signal of the first selection control signal terminal VN-1 to the first second child node N2-1 to make the first second child node N2-1 be provided with a high-level signal, so that the first fifth transistor M5-1, the first seventh transistor M7-1 and the first ninth transistor M9-1 are all turned on. The turned-on first fifth transistor M5-1 may supply the low-level signal of the first reference signal terminal VREF1 to the first node N1 to make the first node N1 be provided with a low-level signal. The turned-on first seventh transistor M7-1 may supply the low-level signal of the first reference signal terminal VREF1 to the cascade signal output terminal COUT, and stabilize the voltage by the first capacitor C1, so that the cascade signal output terminal COUT outputs a low-level signal. The turned-on first ninth transistor M9-1 may supply a low-level signal of the first reference signal terminal VREF1 to the drive signal output terminal GOUT, so that the drive signal output terminal GOUT outputs a low-level signal.

In the T20 phase, since the first selection control signal terminal VN-1 is provided with a low-level signal, the first first transistor M1-1 is turned off.

In the input phase T21, IP=1, CLK=0, RE=0.

Since RE=0, the eleventh transistor M11 is turned off. Since IP=1, the tenth transistor M10 is turned on to supply a high-level signal of the input signal terminal IP to the first node N1, which makes the first node N1 be provided with a high-level signal, and controls the first third transistor M3-1, the first fourth transistor M4-1, the second third transistor M3-2, the second fourth transistor M4-2, the sixth transistor M6 and the eighth transistor M8 to be turned on. The turned-on first fourth transistor M4-1 may supply the low-level signal of the first reference signal terminal VREF1 to the gate of the first second transistor M2-1 to control the first second transistor M2-1 to be turned off. The turned-on first third transistor M3-1 may supply the low-level signal of the first reference signal terminal VREF1 to the first second child node N2-1 to make the first second child node N2-1 be provided with a low-level signal and control the first fifth transistor M5-1, the first seventh transistor M7-1 and the first ninth transistor M9-1 to be turned off. The turned-on second fourth transistor M4-2 may supply the low-level signal of the first reference signal terminal VREF1 to the gate of the second second transistor M2-2 to control the second second transistor M2-2 to be turned off. The turned-on second third transistor M3-2 may supply the low-level signal of the first reference signal terminal VREF1 to the second second child node N2-2 to make the second second child node N2-2 be provided with a low-level signal and control the second fifth transistor M5-2, the second seventh transistor M7-2 and the second ninth transistor M9-2 to be turned off.

The turned-on sixth transistor M6 may supply a low-level signal of the clock signal terminal CLK to the cascade signal output terminal COUT, and stabilize the voltage through the first capacitor C1, so that the cascade signal output terminal COUT outputs a low-level signal. The turned-on eighth transistor M8 may supply the low-level signal of the clock signal terminal CLK to the drive signal output terminal GOUT, so that the drive signal output terminal GOUT outputs a low-level signal.

In the output phase T22, IP=0, CLK=1, RE=0.

Since RE=0, the eleventh transistor M11 is turned off. Since IP=0, the tenth transistor M10 is turned off. Therefore, the first node N1 is in a floating state. The first node N1 is kept with a high-level signal under the action of the second capacitor C2. When the first node N1 is provided with a high-level signal, the first third transistor M3-1, the first fourth transistor M4-1, the second third transistor M3-2, the second fourth transistor M4-2, the sixth transistor M6 and the eighth transistor M8 are controlled to be turned on. The turned-on first fourth transistor M4-1 may supply the low-level signal of the first reference signal terminal VREF1 to the gate of the first second transistor M2-1 to control the first second transistor M2-1 to be turned off. The turned-on first third transistor M3-1 may supply the low-level signal of the first reference signal terminal VREF1 to the first second child node N2-1 to make the first second child node N2-1 be provided with a low-level signal and control the first fifth transistor M5-1, the first seventh transistor M7-1 and the first ninth transistor M9-1 to be turned off. The turned-on second fourth transistor M4-2 may supply the low-level signal of the first reference signal terminal VREF1 to the gate of the second second transistor M2-2 to control the second second transistor M2-2 to be turned off. The turned-on second third transistor M3-2 may supply the low-level signal of the first reference signal terminal VREF1 to the second second child node N2-2 to make the second second child node N2-2 be provided with a low-level signal and control the second fifth transistor M5-2, the second seventh transistor M7-2 and the second ninth transistor M9-2 to be turned off.

The turned-on sixth transistor M6 may supply a high-level signal of the clock signal terminal to the cascade signal output terminal COUT, and stabilize the voltage through the first capacitor C1, so that the cascade signal output terminal COUT outputs a high-level signal. The turned-on eighth transistor M8 may supply the high-level signal from the clock signal terminal to the drive signal output terminal GOUT. The first node N1 is in a floating state, and the voltage of the first node N1 is further raised to cause the eighth transistor M8 to be turned on as completely as possible. In this case, the high-level signal of the clock signal terminal may be supplied to the drive signal output terminal GOUT without a voltage loss as much as possible, so that the drive signal output terminal GOUT may output a high-level signal.

In the reset phase T23, IP=0, CLK=0 and RE=1.

Since IP=0, the tenth transistor M10 is turned off. Since IP=1, the eleventh transistor M11 is turned on to supply a low-level signal of the first reference signal terminal VREF1 to the first node N1, which makes the first node N1 be provided with a low-level signal, and controls the first third transistor M3-1, the first fourth transistor M4-1, the second third transistor M3-2, the second fourth transistor M4-2, the sixth transistor M6 and the eighth transistor M8 to be turned off. In addition, the first second child node N2-1 is kept with a low-level signal to control the first fifth transistor M5-1, the first seventh transistor M7-1 and the first ninth transistor M9-1 to be turned off.

The second first transistor M1-2 is turned on under the control of a high-level signal of the second selection control signal terminal VN-2, so as to supply a high-level signal of the second selection control signal terminal VN-2 to the gate of the second second transistor M2-2, and thus control the second second transistor M2-2 to be turned on. The turned-on second second transistor M2-2 may supply the high-level signal of the second selection control signal terminal VN-2 to the second second child node N2-2 to make the second second child node N2-2 be provided with a high-level signal and control the second fifth transistor M5-2, the second seventh transistor M7-2 and the second ninth transistor M9-2 to be turned on. The turned-on second fifth transistor M5-2 may supply the low-level signal of the first reference signal terminal VREF1 to the first node N1 to make the first node N1 be further provided with a low-level signal. The turned-on second seventh transistor M7-2 may supply the low-level signal of the first reference signal terminal VREF1 to the cascade signal output terminal COUT, and stabilize the voltage by the first capacitor C1, so that the cascade signal output terminal COUT outputs a low-level signal. The turned-on second ninth transistor M9-2 may supply the low-level signal of the first reference signal terminal VREF1 to the drive signal output terminal GOUT, so that the drive signal output terminal GOUT outputs a low-level signal.

Figure 13:
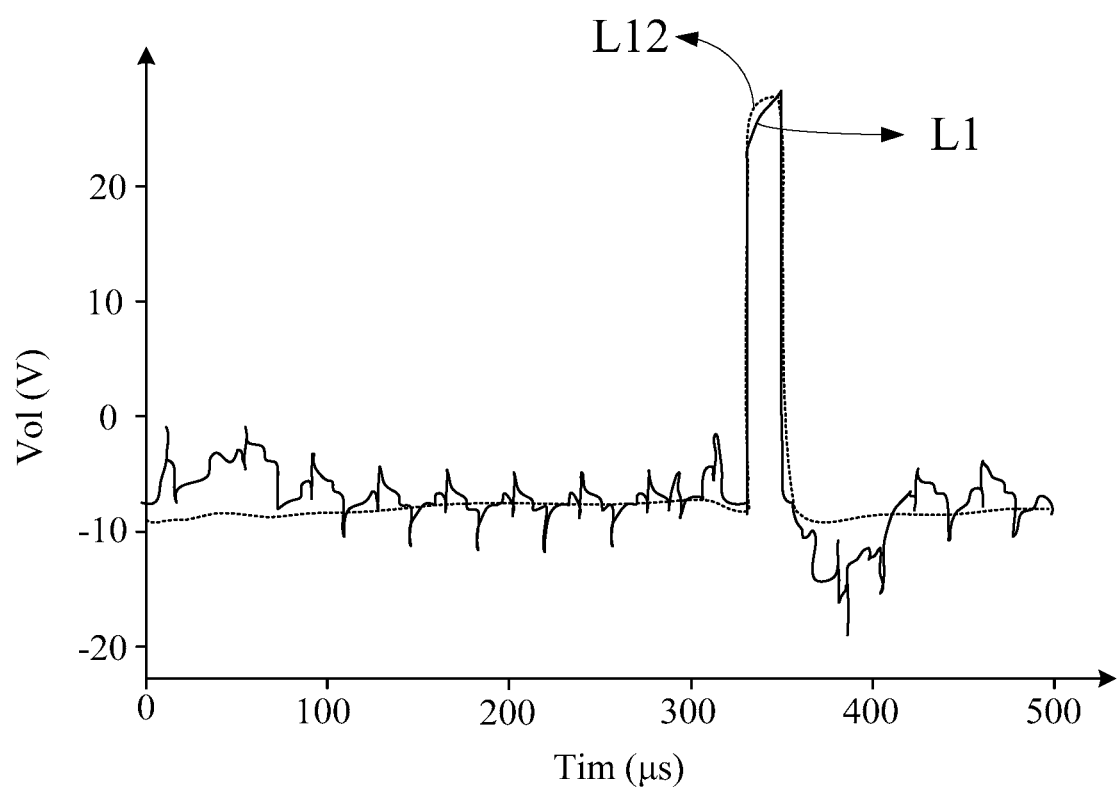
FIG. 13 is an analogue simulation diagram of a cascade signal output terminal of the shift register shown in FIG. 11.

In addition, taking a shift register that has been used for 25000 h as an example, according to the signal time sequence diagram shown in FIG. 12A, a signal output by the cascade signal output terminal of the shift register shown in FIG. 11 is tested, as shown in FIG. 13. Wherein, the abscissa represents time, and the ordinate represents the voltage output by the cascade signal output terminal COUT. L1 represents a voltage output by the output terminal COUT of the shift register that has been used for 25000 h shown in FIG. 2, and L12 represents a voltage output by the cascade signal output terminal COUT of the shift register that has been used for 25000 h shown in FIG. 11. In combination with FIG. 13, and by comparing L12 with L1, the first capacitor C1 is set in the embodiment of the present disclosure to compensate the load capacitance of the cascade signal output terminal COUT, and the charging and discharging process of the first capacitor C1 is combined to reduce a noise of a signal of the cascade signal output terminal COUT and improve the signal stability of the cascade signal output terminal COUT.

In addition, for the shift register provided by the embodiment of the present disclosure, the first sub-control circuit 3-1 works in the T10 phase, and the second sub-control circuit 3-2 works in the T20 phase. Thus, the characteristics of transistors may be recovered alternately, and the influence on the stability and life of output signals caused by the characteristic drift due to the use of transistors may be reduced, so that the life of products may be enhanced and the production cost may be reduced.

It should be noted that when the shift register works according to the signal time sequence diagram shown in FIG. 12B, the working process is roughly the same as the above working process, and will not be described in detail herein.

Figure 14:
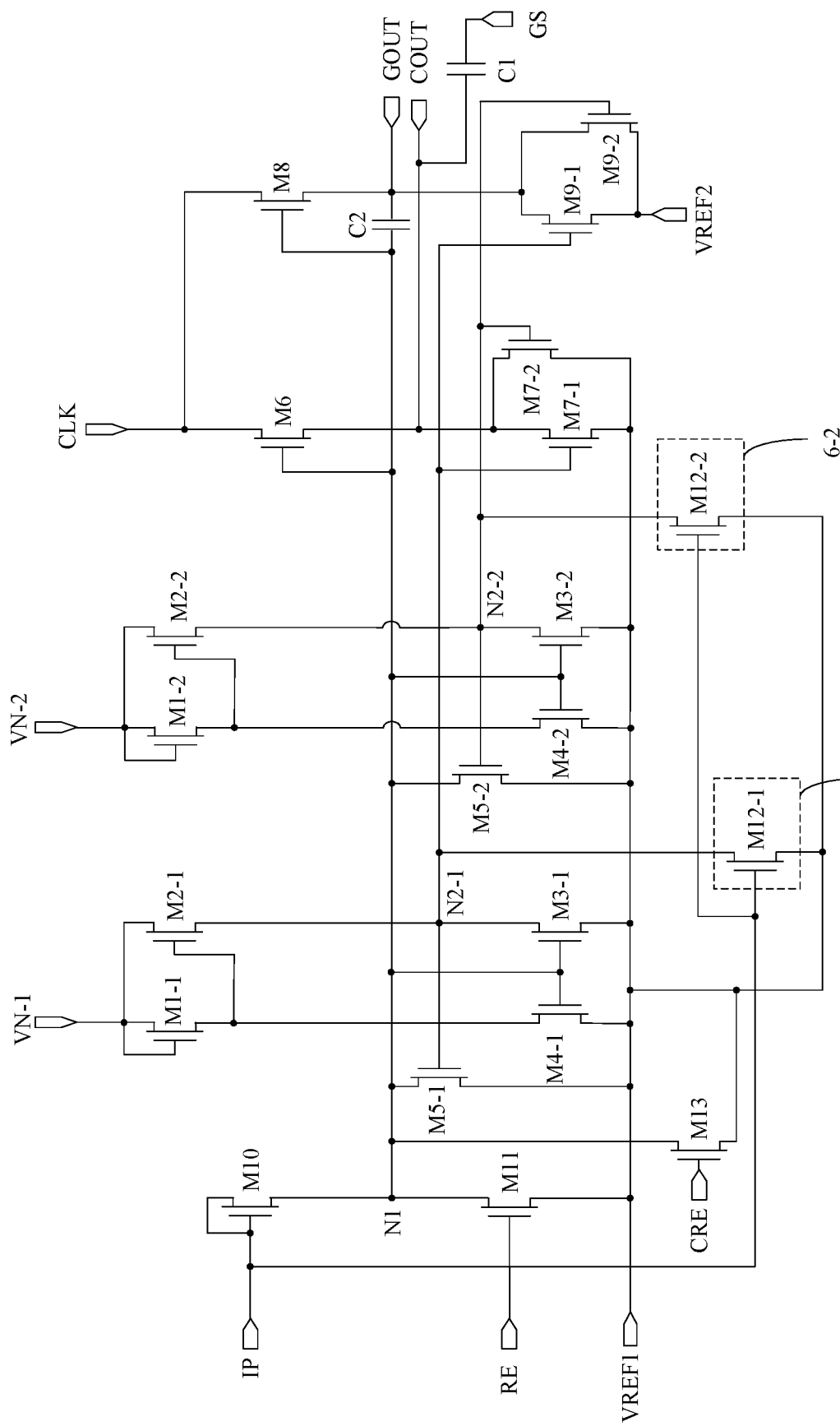
FIG. 14 is a schematic diagram of some specific structures of a shift register according to an embodiment of the present disclosure.

The embodiment of the present disclosure also provides some structural schematic diagrams of shift registers, as shown in FIG. 14, which are modified with respect to the implementation of the above embodiments. Only the differences between this embodiment and the above embodiments will be explained below, and the similarities will not be repeated herein.

Exemplarily, M=2 may be made. According to an embodiment of the present disclosure, as shown in FIG. 14, the shift register further includes two node voltage regulator circuits; wherein a first node voltage regulator circuit 6-1 corresponds to the first second child node N2-1, and a second node voltage regulator circuit 6-2 corresponds to the second second child node N2-2. Furthermore, the first node voltage regulator circuit 6-1 is configured to supply a signal of the first reference signal terminal VREF1 to the first second child node N2-1 in response to a signal of the input signal terminal IP. The second node voltage regulator circuit 6-2 is configured to supply a signal of the first reference signal terminal VREF1 to the second second child node N2-2 in response to a signal of the input signal terminal IP.

Exemplarily, as shown in FIG. 14, the first node voltage regulator circuit 6-1 may include a first twelfth transistor M12-1; wherein a control terminal of the first twelfth transistor M12-1 is electrically connected to the input signal terminal IP, a first terminal of the first twelfth transistor M12-1 is electrically connected to the first reference signal terminal VREF1, and a second terminal of the first twelfth transistor M12-1 is electrically connected to the first second child node N2-1.

Exemplarily, as shown in FIG. 14, the second node voltage regulator circuit 6-2 may include a second twelfth transistor M12-2; wherein a control terminal of the second twelfth transistor M12-2 is electrically connected to the input signal terminal IP, a first terminal thereof is electrically connected to the first reference signal terminal VREF1, and a second terminal of the second twelfth transistor M12-2 is electrically connected to the second second child node N2-2.

Further, in a specific implementation, as shown in FIG. 14, the shift register may further include a thirteenth transistor M13; wherein a control terminal of the thirteenth transistor M13 is electrically connected to the initial reset signal terminal RE, a first terminal of the thirteenth transistor M13 is electrically connected to the first reference signal terminal VREF1, and a second terminal of the thirteenth transistor M13 is electrically connected to the first node N1.

The foregoing examples only illustrate the specific structure of the shift register provided by the embodiment of the present disclosure. In a specific implementation, the specific structure of each of the circuits is not limited to the above structure provided by the embodiment of the present disclosure, but may also be other structures known to a person skilled in the art, and is not limited herein.

The working process of the shift register provided by the embodiment of the present disclosure will be described below by reference to the structure of the shift register shown in FIG. 14 as an example and in combination with the signal time sequence diagram shown in FIG. 15. The working process corresponding to this embodiment is partially the same as that of the shift register shown in FIG. 11, and only the different contents of the working process will be described below.

In the T10 phase, a frame reset phase T01 may also be included before the input phase T11. In the frame reset phase T01, the initial reset signal terminal RE is provided with a high-level signal to control the thirteenth transistor M13 to be turned on to supply a low-level signal of the first reference signal terminal VREF1 to the first node N1. Thus, the first node N1 may be pre-set to further reduce the noise of the cascade signal output terminal COUT. Moreover, in the input phase T11, the first twelfth transistor M12-1 is turned on under the control of a high-level signal of the input signal terminal IP, so as to supply a low-level signal of the first reference signal terminal to the first second child node N2-1. Thus, the first second child node N2-1 is kept with a low-level signal to further reduce the noise of the cascade signal output terminal COUT. The second twelfth transistor M12-2 is turned on under the control of a high-level signal of the input signal terminal IP, so as to supply the low-level signal of the first reference signal terminal to the second second child node N2-2. Thus, the second second child node N2-2 is provided with a low-level signal to further reduce the noise of the cascade signal output terminal COUT.

In the T20 phase, a frame reset phase T02 may also be included before the input phase T21. In the frame reset phase T02, the initial reset signal terminal RE is provided with a high-level signal to control the thirteenth transistor M13 to be turned on to supply a low-level signal of the first reference signal terminal VREF1 to the first node N1. Thus, the first node N1 may be pre-set to further reduce the noise of the cascade signal output terminal COUT. Moreover, in the input phase T21, the first twelfth transistor M12-1 is turned on under the control of a high-level signal of the input signal terminal IP, so as to supply a low-level signal of the first reference signal terminal to the first second child node N2-1. Thus, the first second child node N2-1 is provided with a low-level signal to further reduce the noise of the cascade signal output terminal COUT. The second twelfth transistor M12-2 is turned on under the control of a high-level signal of the input signal terminal IP, so as to supply a low-level signal of the first reference signal terminal to the second second child node N2-2. Thus, the second second child node N2-2 is provided with a low-level signal to further reduce the noise of the cascade signal output terminal COUT.

Figure 15:
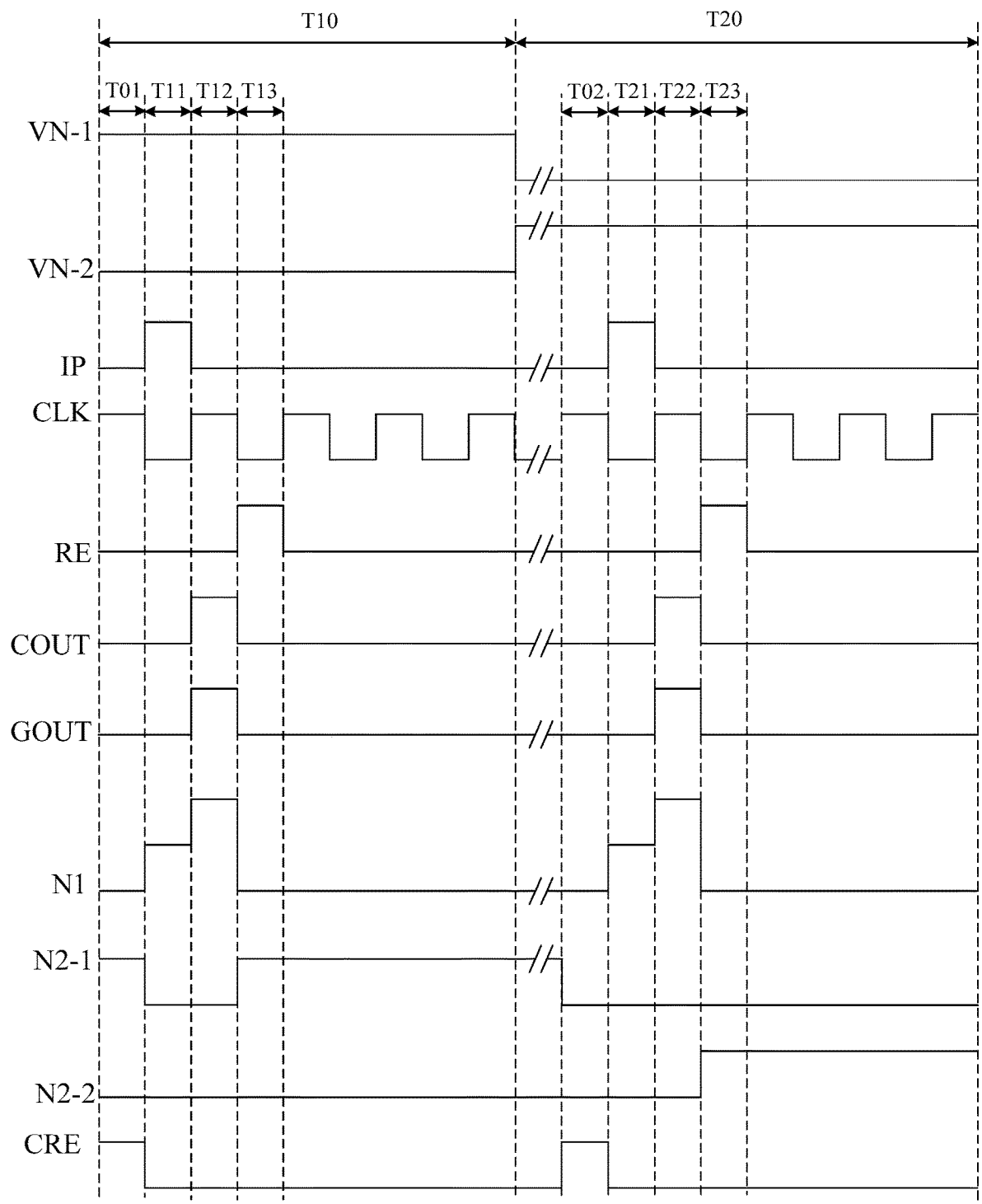
FIG. 15 is a signal time sequence diagram of the shift register shown in FIG. 14.
Figure 16:
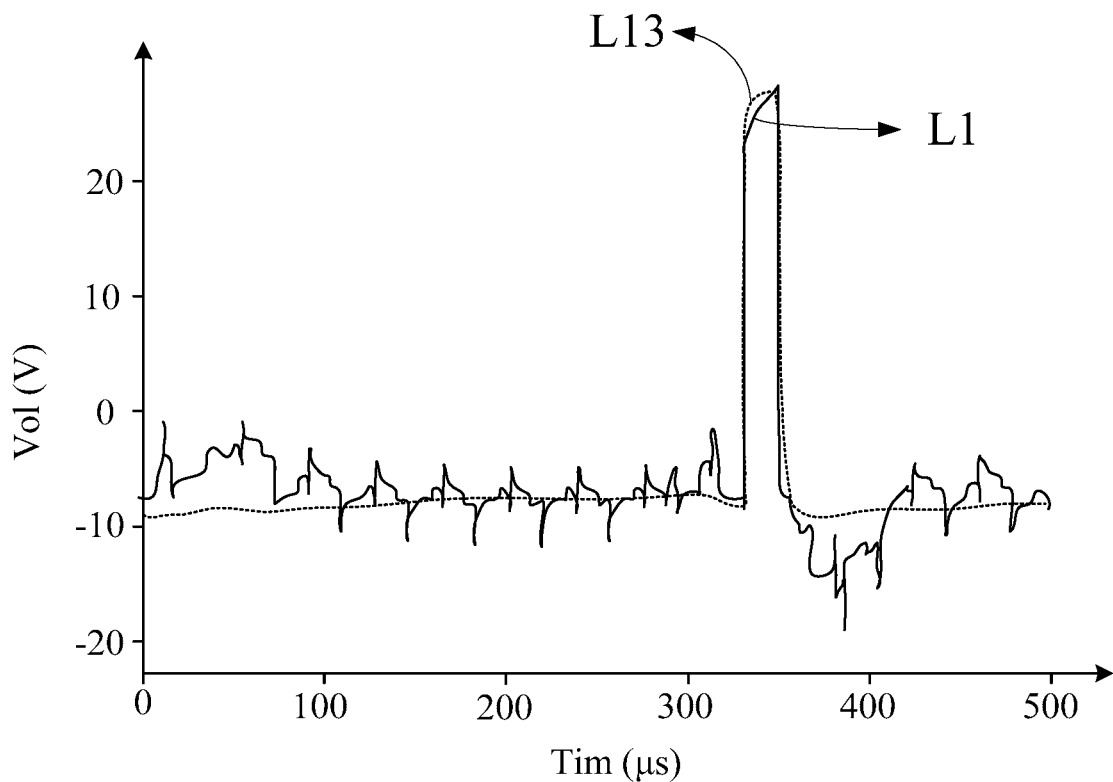
FIG. 16 is an analogue simulation diagram of a cascade signal output terminal of the shift register shown in FIG. 14.

In addition, taking a shift register that has been used for 25000 h as an example, according to the signal time sequence diagram shown in FIG. 15, a signal output by the cascade signal output terminal of the shift register shown in FIG. 14 is tested, as shown in FIG. 16. Wherein, the abscissa represents time, and the ordinate represents the voltage output by the cascade signal output terminal COUT. L1 represents a voltage output by the output terminal COUT of the shift register that has been used for 25000 h shown in FIG. 2, and L13 represents a voltage output by the cascade signal output terminal COUT of the shift register that has been used for 25000 h shown in FIG. 14. In combination with FIG. 16, and by comparing L13 with L1, the first capacitor C1 is set in the embodiment of the present disclosure to compensate the load capacitance of the cascade signal output terminal COUT, and the charging and discharging process of the first capacitor C1 is combined to reduce a noise of a signal of the cascade signal output terminal COUT and improve the signal stability of the cascade signal output terminal COUT.

Figure 17:
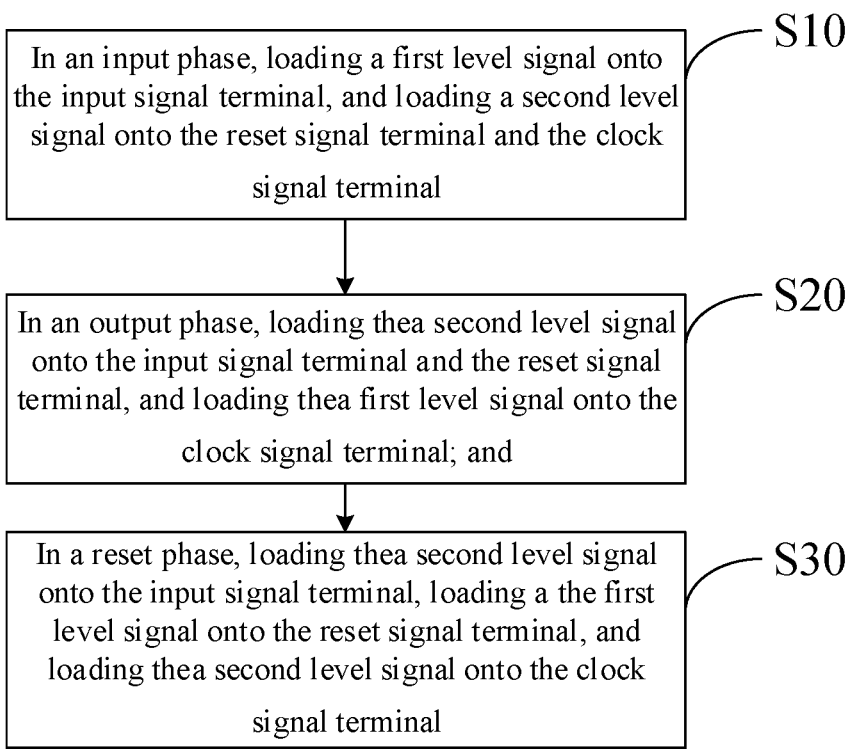
FIG. 17 is a flowchart of a driving method according to an embodiment of the present disclosure.

Based on the same inventive concept, the embodiments of the present disclosure also provide a driving method for a shift register, as shown in FIG. 17, wherein the method may include the following steps.

S10, in an input phase, a first level signal is loaded onto the input signal terminal IP, and a second level signal is loaded onto the reset signal terminal RE and the clock signal terminal.

S20, in an output phase, the second level signal is loaded onto the input signal terminal IP and the reset signal terminal RE, and the first level signal is loaded onto the clock signal terminal.

S30, in a reset phase, the second level signal is loaded onto the input signal terminal IP, the first level signal is loaded onto the reset signal terminal RE, and the second level signal is loaded onto the clock signal terminal.

According to the above driving method provided by the embodiment of the present disclosure, the shift register may output a stable signal. In a specific implementation, according to the above driving method provided by the embodiment of the present disclosure, the first level may be a high level, and correspondingly, the second level may be a low level; alternatively, the first level may be a low level, and correspondingly, the second level may be a high level, depending on whether the transistor in the shift register is an N-type transistor or a P-type transistor. Specifically, FIG. 7, FIG. 10, FIG. 12A, FIG. 12B and FIG. 15 are signal time sequence diagrams in which the transistor in the shift register is an N-type transistor, the first level is a high level and the second level is a low level.

Figure 18:
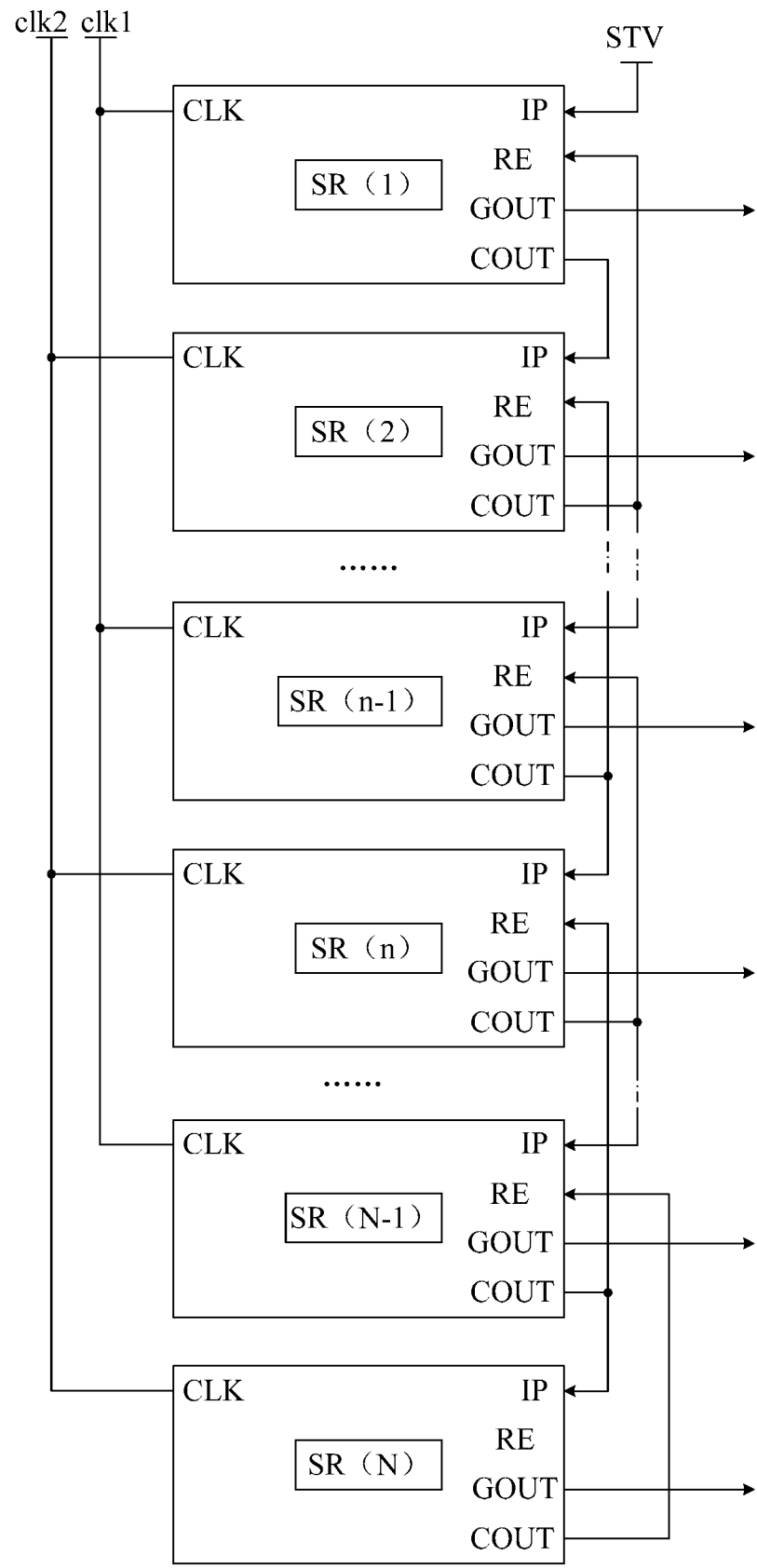
FIG. 18 is a schematic structural diagram of a drive circuit according to an embodiment of the present disclosure.

Based on the same inventive concept, the embodiments of the present disclosure also provide a gate drive circuit, as shown in FIG. 18, including a plurality of cascaded shift registers provided by the embodiments of the present disclosure: SR(1), SR(2) . . . SR(n−1), SR(n) . . . SR(N−1), SR(N) (a total of N shift registers, 1≤n≤N, and n and N are positive integers), wherein:

an input signal terminal IP of a first-stage shift register SR(1) is electrically connected to a frame trigger signal terminal STV;

in adjacent two-stage shift registers, an input signal terminal IP of a next-stage shift register SR(n) is electrically connected to a cascade signal output terminal COUT of a previous-stage shift register SR(n−1), and a reset signal terminal RE of the previous-stage shift register SR(n−1) is electrically connected to the cascade signal output terminal COUT of the next-stage shift register SR(n).

Specifically, each shift register in the above gate drive circuit is functionally and structurally identical to the shift registers provided by the embodiment of the present disclosure, and the repetition is not described herein.

In a specific implementation, according to the gate drive circuit provided by the embodiment of the present disclosure, as shown in FIG. 18, clock signal terminals CLK of odd-numbered shift registers are electrically connected to one same clock terminal clk1, and clock signal terminals CLK of even-numbered shift registers are electrically connected to one same clock terminal clk2.

In a specific implementation, according to the gate drive circuit provided by the embodiment of the present disclosure, first reference signal terminals VREF1 of all-stage shift registers are electrically connected to one same first reference terminal, and second reference signal terminals of all-stage shift registers are electrically connected to one same second reference terminal.

In a specific implementation, when the shift register includes the thirteenth transistor M13, initial reset signal terminals RE of all-stage of shift registers may be electrically connected to one same initial reset terminal RE according to the gate drive circuit provided by the embodiment of the present disclosure. In this way, the first nodes N1 of all-stage shift registers may be reset at the same time.

Based on the same inventive concept, the embodiments of the present disclosure also provide a display device, including the drive circuit provided by the embodiment of the present disclosure. Since the principle of solving the problem of the display device is similar to that of the drive circuit, the implementation of the display device may refer to that of the drive circuit, and the repetition is not described herein.

In most cases, a display panel in a display device is provided with a plurality of gate lines, and one shift register may correspond to at least one gate line. Exemplarily, one shift register may correspond to one gate line so that the drive signal output terminal GOUT of each shift register may be electrically connected to one gate line.

In a specific implementation, according to an embodiment of the present disclosure, the display device may be any product or component with display function, such as a mobile phone, a tablet computer, a TV, a display, a laptop, a digital photo frame and a navigator. Other essential components of the display device should be understood by a person of ordinary skill in the art and should not be described herein, nor should they be used as a limitation to the present disclosure.

According to the shift register, the driving method thereof, the drive circuit and the display device provided by the embodiment of the present disclosure, the first capacitor is provided with the first terminal electrically connected to the cascade signal output terminal and the second terminal electrically connected to the fixed voltage signal terminal, so that the load capacitance of the cascade signal output terminal is compensated, and the charging and discharging process of the first capacitor is combined to reduce a noise of a signal of the cascade signal output terminal and improve the signal stability of the cascade signal output terminal.

It will be clear to those skilled in the art that various modifications and variations may be made to the present disclosure without departing from the spirit and scope of the present disclosure. Thus, if these modifications and variations of the present disclosure fall within the scope of the claims of the present disclosure and their equivalents, the present disclosure is also intended to include these modifications and variations.

What is claimed is:

1. A shift register, comprising:
    an input circuit, configured to, in response to a signal of an input signal terminal, supply the signal of the input signal terminal to a first node;
    a reset circuit, configured to, in response to a signal of a reset signal terminal, supply a signal of a first reference signal terminal to the first node;
    a control circuit, configured to adjust a signal of the first node and a signal of a second node;
    a first output circuit, configured to output a signal from a cascade signal output terminal according to the signal of the first node and the signal of the second node;
    a first capacitor, provided with a first terminal electrically connected to the cascade signal output terminal, and a second terminal electrically connected to a fixed voltage signal terminal;
    wherein the fixed voltage signal terminal is same as the first reference signal terminal or a second reference signal terminal or a ground terminal; and
    a second output circuit, configured to output a signal from a drive signal output terminal according to the signal of the first node and the signal of the second node; wherein the second output circuit comprises a second capacitor, a first terminal of the second capacitor is electrically connected to the first node, and a second terminal of the second capacitor is electrically connected to the drive signal output terminal; the drive signal output terminal is electrically connected to a gate line of a display panel.

2. The shift register according to claim 1, wherein the second node comprises M second child nodes; and the control circuit comprises M sub-control circuits; wherein an $m^{th}$ sub-control circuit of the M sub-control circuits corresponds to an $m^{th}$ second child node of the M second child nodes; M is an integer and M≥1, and m is an integer and 1≤m≤M;
    the $m^{th}$ sub-control circuit is configured to adjust a signal of the $m^{th}$ second child node and the signal of the first node;
    the first output circuit is configured to output a signal from the cascade signal output terminal according to the signal of the first node and signals of the M second child nodes; and
    the second output circuit is configured to output a signal from the drive signal output terminal according to the signal of the first node and the signals of the M second child nodes.

3. The shift register according to claim 2, wherein the $m^{th}$ sub-control circuit corresponds to an $m^{th}$ selection control signal terminal;
    the $m^{th}$ sub-control circuit includes an $m^{th}$ first transistor, an $m^{th}$ second transistor, an $m^{th}$ third transistor, an $m^{th}$ fourth transistor and an $m^{th}$ fifth transistor;
    a control terminal and a first terminal of the $m^{th}$ first transistor are electrically connected to the $m^{th}$ selection control signal terminal, and a second terminal of the $m^{th}$ first transistor is electrically connected to a control terminal of the $m^{th}$ second transistor;
    a first terminal of the $m^{th}$ second transistor is electrically connected to the $m^{th}$ selection control signal terminal, and a second terminal of the $m^{th}$ second transistor is electrically connected to the $m^{th}$ second child node;
    a control terminal of the $m^{th}$ third transistor is electrically connected to the first node, a first terminal of the $m^{th}$ third transistor is electrically connected to the first reference signal terminal, and a second terminal of the $m^{th}$ third transistor is electrically connected to the $m^{th}$ second child node;
    a control terminal of the $m^{th}$ fourth transistor is electrically connected to the first node, a first terminal of the $m^{th}$ fourth transistor is electrically connected to the first reference signal terminal, and a second terminal of the $m^{th}$ fourth transistor is electrically connected to a control terminal of the $m^{th}$ second transistor; and
    a control terminal of the $m^{th}$ fifth transistor is electrically connected to the $m^{th}$ second child node, a first terminal of the $m^{th}$ fifth transistor is electrically connected to the first reference signal terminal, and a second terminal of the $m^{th}$ fifth transistor is electrically connected to the first node.

4. The shift register according to claim 2, wherein the first output circuit comprises a sixth transistor and M seventh transistors; wherein an $m^{th}$ seventh transistor of the M seventh transistors corresponds to the $m^{th}$ second child node;
    a control terminal of the sixth transistor is electrically connected to the first node, a first terminal of the sixth transistor is electrically connected to a clock signal terminal, and a second terminal of the sixth transistor is electrically connected to the cascade signal output terminal; and a control terminal of the $m^{th}$ seventh transistor is electrically connected to the $m^{th}$ second child node, a first terminal of the $m^{th}$ seventh transistor is electrically connected to the first reference signal terminal, and a second terminal of the $m^{th}$ seventh transistor is electrically connected to the cascade signal output terminal.

5. The shift register according to claim 2, wherein the second output circuit further comprises an eighth transistor and M ninth transistors;

wherein an $m^{th}$ ninth transistor of the M ninth transistors corresponds to the $m^{th}$ second child node;

a control terminal of the eighth transistor is electrically connected to the first node, a first terminal of the eighth transistor is electrically connected to a clock signal terminal, and a second terminal of the eighth transistor is electrically connected to the drive signal output terminal; and a control terminal of the $m^{th}$ ninth transistor is electrically connected to the $m^{th}$ second child node, a first terminal of the $m^{th}$ ninth transistor is electrically connected to the second reference signal terminal, and a second terminal of the $m^{th}$ ninth transistor is electrically connected to the drive signal output terminal.

6. The shift register according to claim 1, wherein the input circuit comprises a tenth transistor; wherein a control terminal and a first terminal of the tenth transistor are electrically connected to the input signal terminal, and a second terminal of the tenth transistor is electrically connected to the first node; and/or, the reset circuit comprises an eleventh transistor; wherein a control terminal of the eleventh transistor is electrically connected to the reset signal terminal, and a second terminal of the eleventh transistor is electrically connected to the first node.

7. The shift register according to claim 1, further comprising:

M node voltage regulator circuits; wherein an $m^{th}$ node voltage regulator circuit of the M node voltage regulator circuits corresponds to the $m^{th}$ second child node; and the $m^{th}$ node voltage regulator circuit is configured to supply the signal of the first reference signal terminal to the $m^{th}$ second child node in response to the signal of the input signal terminal; M is an integer and M≥1, and m is an integer and 1≤m≤M.

8. The shift register according to claim 7, wherein the $m^{th}$ node voltage regulator circuit comprises an $m^{th}$ twelfth transistor;

a control terminal of the $m^{th}$ twelfth transistor is electrically connected to the input signal terminal, a first terminal of the $m^{th}$ twelfth transistor is electrically connected to the first reference signal terminal, and a second terminal of the $m^{th}$ twelfth transistor is electrically connected to the $m^{th}$ second child node.

9. The shift register according to claim 1, wherein the shift register further comprises a thirteenth transistor;

a control terminal of the thirteenth transistor is electrically connected to an initial reset signal terminal, a first terminal of the thirteenth transistor is electrically connected to the first reference signal terminal, and a second terminal of the thirteenth transistor is electrically connected to the first node.

10. A drive circuit, comprising a plurality of cascaded shift registers each according to claim 1;

an input signal terminal of a first-stage shift register is electrically connected to a frame trigger signal terminal;

in adjacent two-stage shift registers, an input signal terminal of a next-stage shift register is electrically connected to a cascade signal output terminal of a previous-stage shift register, and a reset signal terminal of the previous-stage shift register is electrically connected to a cascade signal output terminal of the next-stage shift register.

11. A display device, comprising the drive circuit according to claim 10.

12. A driving method for the shift register according to claim 1, comprising:

in an input phase, loading a first level signal onto the input signal terminal, and loading a second level signal onto the reset signal terminal and a clock signal terminal;

in an output phase, loading the second level signal onto the input signal terminal and the reset signal terminal, and loading the first level signal onto the clock signal terminal; and in a reset phase, loading the second level signal onto the input signal terminal, loading the first level signal onto the reset signal terminal, and loading the second level signal onto the clock signal terminal.

13. A shift register, comprising:

a first first transistor, provided with a control terminal and a first terminal electrically connected to a first selection control signal terminal, and a second terminal electrically connected to a control terminal of a first second transistor;

the first second transistor, provided with a first terminal electrically connected to the first selection control signal terminal, and a second terminal electrically connected to a first second child node;

a first third transistor, provided with a control terminal electrically connected to a first node, a first terminal electrically connected to a first reference signal terminal, and a second terminal electrically connected to the first second child node;

a first fourth transistor, provided with a control terminal electrically connected to the first node, a first terminal electrically connected to the first reference signal terminal, and a second terminal electrically connected to a control terminal of the first second transistor;

a first fifth transistor, provided with a control terminal electrically connected to the first second child node, a first terminal electrically connected to the first reference signal terminal, and a second terminal electrically connected to the first node;

a sixth transistor, provided with a control terminal electrically connected to the first node, a first terminal electrically connected to a clock signal terminal, and a second terminal electrically connected to a cascade signal output terminal;

a first seventh transistor, provided with a control terminal electrically connected to the first second child node, a first terminal electrically connected to the first reference signal terminal, and a second terminal electrically connected to the cascade signal output terminal;

an eighth transistor, provided with a control terminal electrically connected to the first node, a first terminal electrically connected to the clock signal terminal, and a second terminal electrically connected to a drive signal output terminal;

a first ninth transistor, provided with a control terminal electrically connected to the first second child node, a first terminal electrically connected to a second reference signal terminal, and a second terminal electrically connected to the drive signal output terminal;

a tenth transistor, provided with a control terminal and a first terminal electrically connected to an input signal terminal, and a second terminal electrically connected to the first node;

an eleventh transistor, provided with a control terminal electrically connected to a reset signal terminal, and a second terminal electrically connected to the first node;

a twelfth transistor, provided with a control terminal electrically connected to the input signal terminal, a first terminal electrically connected to the first reference signal terminal, and a second terminal electrically connected to the first second child node; and a thirteenth transistor, provided with a control terminal electrically connected to an initial reset signal terminal, a first terminal electrically connected to the first reference signal terminal, and a second terminal electrically connected to the first node.

14. A shift register, comprising:

a first first transistor, provided with a control terminal and a first terminal electrically connected to a first selection control signal terminal, and a second terminal electrically connected to a control terminal of a first second transistor;

the first second transistor, provided with a first terminal electrically connected to the first selection control signal terminal, and a second terminal electrically connected to a first second child node;

a first third transistor, provided with a control terminal electrically connected to a first node, a first terminal electrically connected to a first reference signal terminal, and a second terminal electrically connected to the first second child node;

a first fourth transistor, provided with a control terminal electrically connected to the first node, a first terminal electrically connected to the first reference signal terminal, and a second terminal electrically connected to a control terminal of the first second transistor;

a first fifth transistor, provided with a control terminal electrically connected to the first second child node, a first terminal electrically connected to the first reference signal terminal, and a second terminal electrically connected to the first node;

a second first transistor, provided with a control terminal and a first terminal electrically connected to a second selection control signal terminal, and a second terminal electrically connected to a control terminal of a second second transistor;

the second second transistor, provided with a first terminal electrically connected to the second selection control signal terminal, and a second terminal electrically connected to a second second child node;

a second third transistor, provided with a control terminal electrically connected to the first node, a first terminal electrically connected to the first reference signal terminal, and a second terminal electrically connected to the second second child node;

a second fourth transistor, provided with a control terminal electrically connected to the first node, a first terminal electrically connected to the first reference signal terminal, and a second terminal electrically connected to the control terminal of the second second transistor;

a second fifth transistor, provided with a control terminal electrically connected to the second second child node, a first terminal electrically connected to the first reference signal terminal, and a second terminal electrically connected to the first node;

a sixth transistor, provided with a control terminal electrically connected to the first node, a first terminal electrically connected to a clock signal terminal, and a second terminal electrically connected to a cascade signal output terminal;

a first seventh transistor, provided with a control terminal electrically connected to the first second child node, a first terminal electrically connected to the first reference signal terminal, and a second terminal electrically connected to the cascade signal output terminal;

a second seventh transistor, provided with a control terminal electrically connected to the second second child node, a first terminal electrically connected to the first reference signal terminal, and a second terminal electrically connected to the cascade signal output terminal;

an eighth transistor, provided with a control terminal electrically connected to the first node, a first terminal electrically connected to the clock signal terminal, and a second terminal electrically connected to a drive signal output terminal;

a first ninth transistor, provided with a control terminal electrically connected to the first second child node, a first terminal electrically connected to a second reference signal terminal, and a second terminal electrically connected to the drive signal output terminal;

a second ninth transistor, provided with a control terminal electrically connected to the second second child node, a first terminal electrically connected to the second reference signal terminal, and a second terminal electrically connected to the drive signal output terminal;

a tenth transistor, provided with a control terminal and a first terminal electrically connected to an input signal terminal, and a second terminal electrically connected to the first node;

an eleventh transistor, provided with a control terminal electrically connected to a reset signal terminal, and a second terminal electrically connected to the first node;

a first twelfth transistor, provided with a control terminal electrically connected to the input signal terminal, and a first terminal electrically connected to the first reference signal terminal, and a second terminal electrically connected to the first second child node;

a second twelfth transistor, provided with a control terminal electrically connected to the input signal terminal, and a first terminal electrically connected to the first reference signal terminal, and a second terminal electrically connected to the second second child node; and a thirteenth transistor, provided with a control terminal electrically connected to an initial reset signal terminal, a first terminal electrically connected to the first reference signal terminal, and a second terminal electrically connected to the first node.

* * * * *